(12) United States Patent
Lee

(10) Patent No.: US 11,778,822 B2
(45) Date of Patent: Oct. 3, 2023

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Jae Hyoung Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 128 days.

(21) Appl. No.: 17/073,835

(22) Filed: Oct. 19, 2020

(65) Prior Publication Data

US 2021/0358943 A1 Nov. 18, 2021

(30) Foreign Application Priority Data

May 15, 2020 (KR) .......................... 10-2020-0058496

(51) Int. Cl.
| | |
|---|---|
| *H01L 27/115* | (2017.01) |
| *H10B 43/27* | (2023.01) |
| *H10B 41/27* | (2023.01) |
| *H10B 63/00* | (2023.01) |
| *H10N 70/00* | (2023.01) |
| *H10N 70/20* | (2023.01) |

(52) U.S. Cl.
CPC ............ *H10B 43/27* (2023.02); *H10B 41/27* (2023.02); *H10B 63/34* (2023.02); *H10B 63/845* (2023.02); *H10N 70/066* (2023.02); *H10N 70/231* (2023.02)

(58) Field of Classification Search
CPC ......... H01L 27/11582; H01L 27/11556; H01L 27/11575; H01L 27/11565; H01L 27/11573; H10B 41/27; H10B 43/27; H10B 43/40
See application file for complete search history.

(56) References Cited

U.S. PATENT DOCUMENTS 10,355,009 B1 * 7/2019 Kai ................... H01L 27/11519

FOREIGN PATENT DOCUMENTS

KR 1020180122847 A 11/2018

* cited by examiner

*Primary Examiner* — Tony Tran
(74) *Attorney, Agent, or Firm* — WILLIAM PARK & ASSOCIATES LTD.

(57) ABSTRACT

A method of manufacturing a semiconductor device includes forming a first stack, forming a sacrificial structure and a first contact passing through the first stack, forming a second stack on the first stack, forming a first hole through the second stack to expose the sacrificial structure, forming a second hole through the first stack by removing the sacrificial structure, forming a channel structure in the first and second holes, and forming a second contact passing through the second stack and coupled to the first contact.

17 Claims, 17 Drawing Sheets

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2020-0058496, filed on May 15, 2020, in the Korean Intellectual Property Office, the entire disclosure of which is incorporated herein by reference.

BACKGROUND

1. Technical Field

Various embodiments of the present disclosure relate to a semiconductor device and a method of manufacturing the semiconductor device, and more particularly, to a three-dimensional semiconductor device and a method of manufacturing the three-dimensional semiconductor device.

2. Related Art

Semiconductor devices include integrated circuits composed of metal oxide semiconductor (MOS) field effect transistors (FETs). Scaling down the size and design of the semiconductor devices is accompanied by a scaling down of the MOS FETs as well.

The scaling down of the MOS FETs may cause a short channel effect, and thus the operating characteristics of the semiconductor devices may be deteriorated. Accordingly, research into various methods for forming semiconductor devices having better performance while overcoming limitations due to the high integration of the semiconductor devices is being conducted.

Furthermore, integrated circuits aim for operational reliability and low power consumption. Therefore, research into devices that have higher reliability and lower power consumption in a small space is also being conducted.

SUMMARY

In accordance with an embodiment of the present disclosure, a method of manufacturing a semiconductor device includes forming a first stack, forming a sacrificial structure and a first contact passing through the first stack, forming a second stack on the first stack, forming a first hole through the second stack to expose the sacrificial structure, forming a second hole through the first stack by removing the sacrificial structure, forming a channel structure in the first and second holes, and forming a second contact passing through the second stack and coupled to the first contact.

Also in accordance with an embodiment of the present disclosure, a method of manufacturing a semiconductor device includes forming a substrate, forming an insulating structure on the substrate, forming a source structure and a first insulating layer on the insulating structure, forming a first contact passing through the source structure and a second contact passing through the first insulating layer, forming a first stack on the source structure and the first insulating layer, forming a third contact passing through the first stack and coupled to the second contact, forming a second stack on the first stack, and forming a fourth contact passing through the second stack and coupled to the third contact.

Further in accordance with an embodiment of the present disclosure, a method of manufacturing a semiconductor device includes forming a substrate, forming an insulating structure on the substrate, forming a source structure and a first insulating layer on the insulating structure, forming a first contact through the source structure, forming a first stack on the source structure and the first insulating layer, forming a second contact through the first stack and the first insulating layer, forming a second stack on the first stack, and forming a third contact passing through the second stack and coupled to the second contact.

Additionally in accordance with an embodiment of the present disclosure, a semiconductor device includes an insulating structure, a source structure and a first insulating layer on the insulating structure, a first contact passing through the source structure, a second contact passing through the first insulating layer, a first stack disposed on the source structure and the first insulating layer, a third contact passing through the first stack and coupled to the second contact, a second stack disposed on the first stack, a fourth contact passing through the second stack and coupled to the third contact, and a channel structure passing through the first and second stacks.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a semiconductor device and a method of manufacturing the semiconductor device, which are capable of improving operational reliability.

Figure 1A:
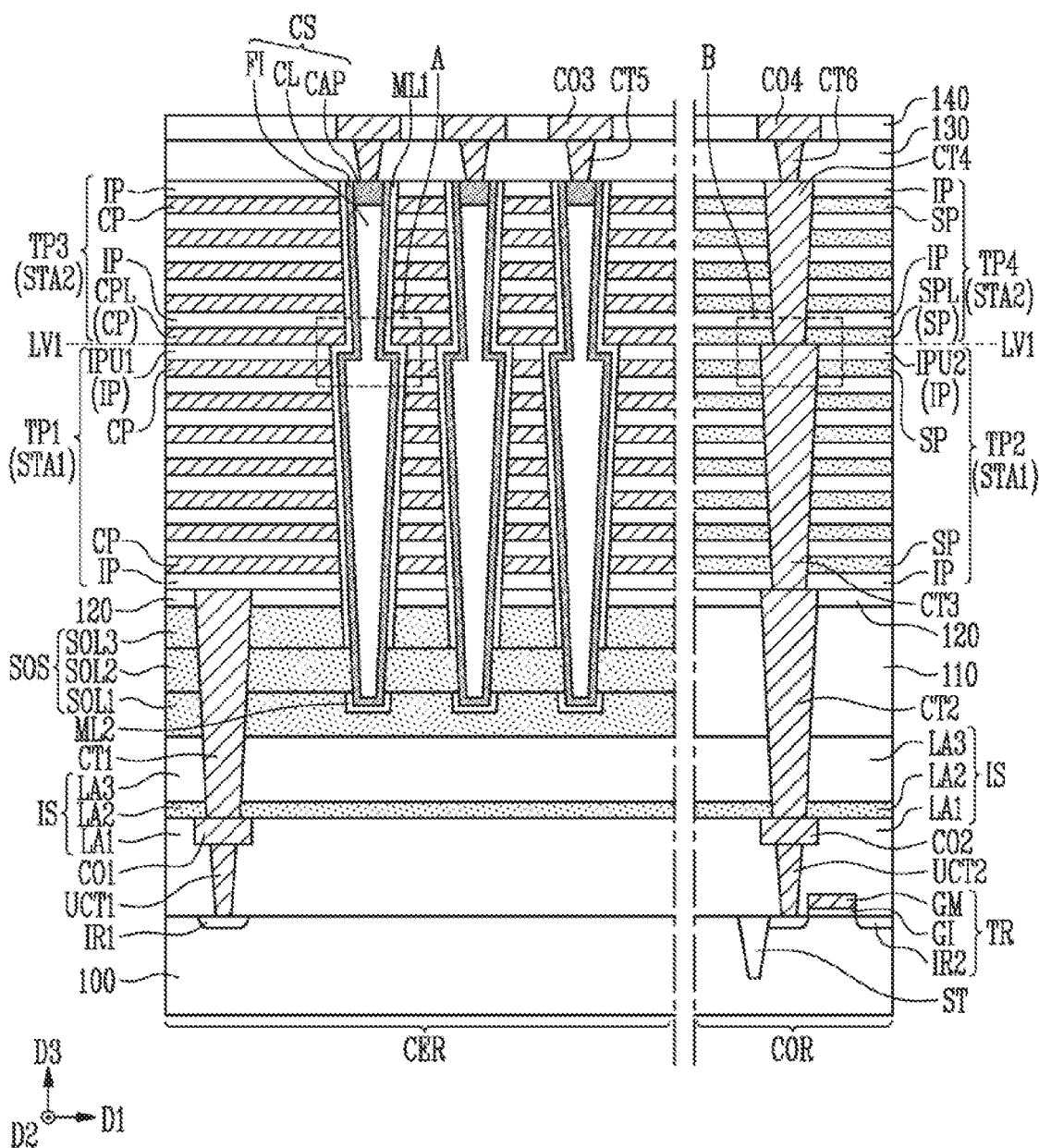
FIG. 1A is a sectional view illustrating a semiconductor device according to an embodiment of the present disclosure.
Figure 1B:
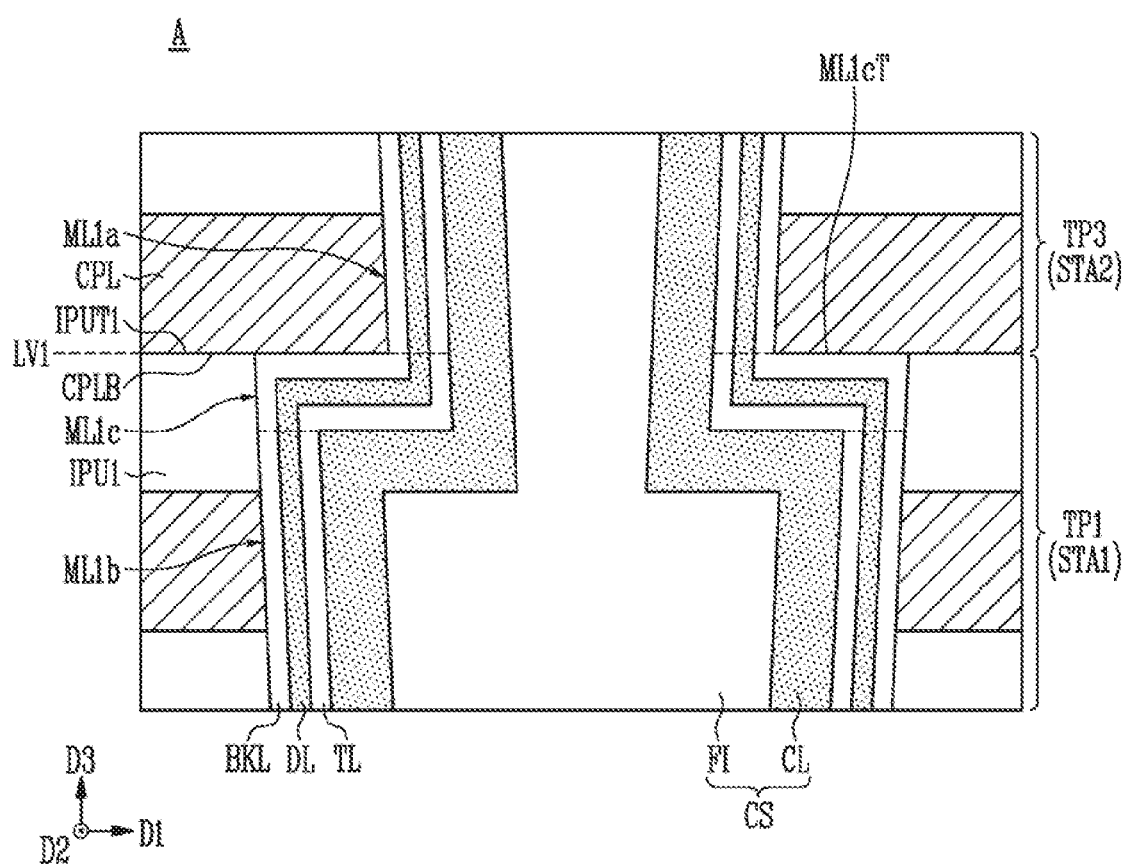
FIG. 1B is an enlarged view of area A of FIG. 1A.
Figure 1C:
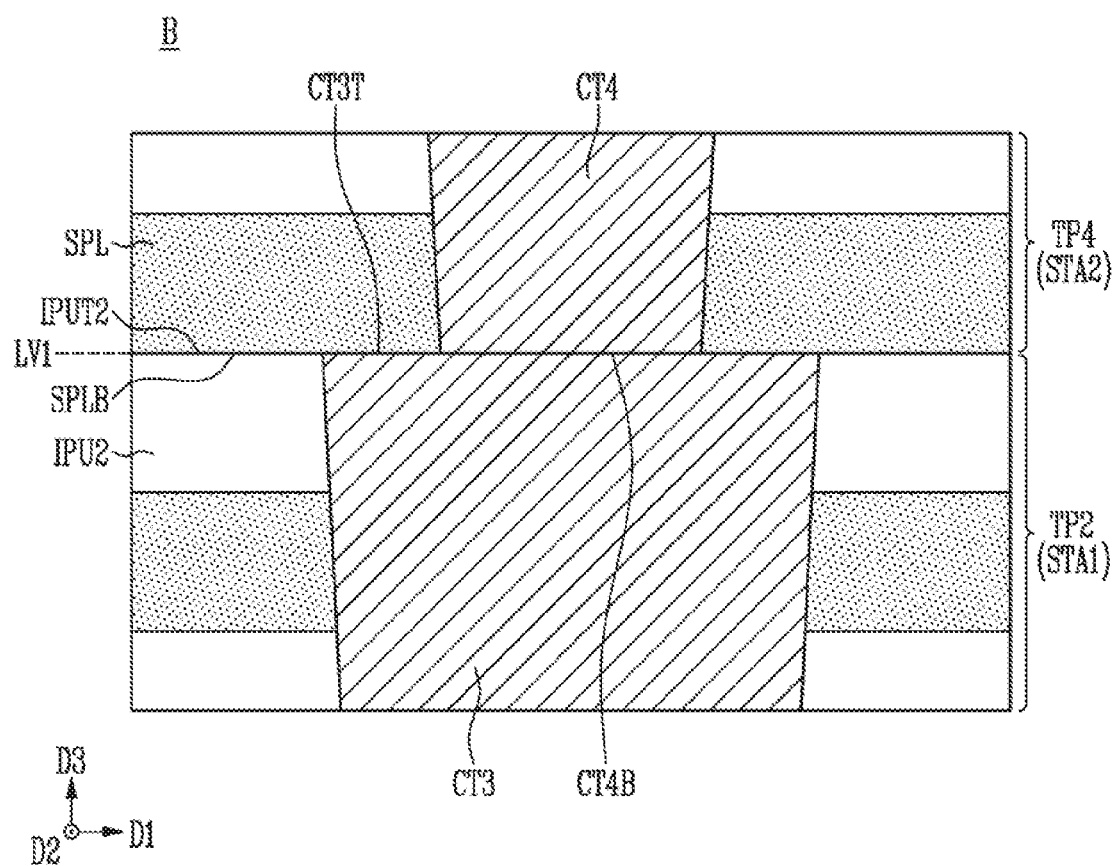
FIG. 1C is an enlarged view of area B of FIG. 1A.

FIG. 1A is a sectional view illustrating a semiconductor device according to an embodiment of the present disclosure. FIG. 1B is an enlarged view of area A of FIG. 1A. FIG. 1C is an enlarged view of area B of FIG. 1A.

Referring to FIGS. 1A to 1C, the semiconductor device according to this embodiment may include a cell region CER and a connection region COR. The cell region CER and the connection region COR may be regions that are separated on a plane.

The semiconductor device according to this embodiment may include a substrate 100. The substrate 100 may have the shape of a plate extending along a plane that is defined by a first direction D1 and a second direction D2. The first direction D1 and the second direction D2 may cross each other. For example, the first direction D1 and the second direction D2 may be perpendicular to each other. The substrate 100 may extend from the cell region CER to the connection region COR. For example, the substrate 100 may extend in the first direction D1.

A first impurity region IR1 may be provided in the substrate 100. The first impurity region IR1 may be provided in the cell region CER. The first impurity region IR1 may be formed by doping impurities onto the substrate 100.

A peripheral transistor TR may be provided on the substrate 100. The peripheral transistor TR may be provided in the connection region COR. The peripheral transistor TR may be one of transistors forming a peripheral circuit of the semiconductor device.

The peripheral transistor TR may include second impurity regions IR2, a gate insulating layer GI, and a gate electrode GM. The second impurity regions IR2 may be provided in the substrate 100. The second impurity regions IR2 may be formed by doping impurities onto the substrate 100. A channel of the peripheral transistor TR may be formed between the second impurity regions IR2. A gate electrode GM may be spaced apart from the substrate 100 with the gate insulating layer GI being interposed therebetween. The gate electrode GM may include a conductive material, and the gate insulating layer GI may include an insulating material.

An element separation layer ST may be provided in the substrate 100. The element separation layer ST may be provided in the connection region COR. The element separation layer ST may electrically separate transistors forming the peripheral circuit from each other. The element separation layer ST may include an insulating material.

An insulting structure IS may be provided on the substrate 100. The insulating structure IS may include a plurality of layers that are sequentially stacked in a third direction D3. The third direction D3 may cross the first direction D1 and the second direction D2. For example, the third direction D3 may be perpendicular to both the first direction D1 and the second direction D2. The insulating structure IS may include a first layer LA1, a second layer LA2, and a third layer LA3 that are sequentially stacked in the third direction D3.

The first layer LA1 may cover the peripheral transistor TR. The first layer LA1 may cover the first impurity region IR1. The first layer LA1 may include an insulating material. For example, the first layer LA1 may include an oxide.

A first under contact UCT1 may be provided in the first layer LA1. The first under contact UCT1 may be provided in the cell region CER. The first under contact UCT1 may be coupled to the first impurity region IR1. A lower surface of the first under contact UCT1 may be in contact with an upper surface of the first impurity region IR1. The first under contact UCT1 may extend in the third direction D3. The first under contact UCT1 may include a conductive material. For example, the first under contact UCT1 may include aluminum, copper, or tungsten.

A first conductive line CO1 may be provided in the first layer LA1. The first conductive line Ca1 may be provided in the cell region CER. The first conductive line Ca1 may be coupled to the first under contact UCT1. A lower surface of the first conductive line CO1 may be coupled to an upper surface of the first under contact UCT1. The first conductive line Cal may include a conductive material. For example, the first conductive line Cal may include aluminum, copper, or tungsten.

A second under contact UCT2 may be provided in the first layer LA1. The second under contact UCT2 may be provided in the connection region COR. In an embodiment, as illustrated in the drawing, the second under contact UCT2 may be coupled to the second impurity region IR2 of the peripheral transistor TR. A lower surface of the second under contact UCT2 may be in contact with an upper surface of the second impurity region IR2. In an embodiment, although not illustrated in the drawing, the second under contact UCT2 may be coupled to the gate electrode GM of the peripheral transistor TR. The second under contact UCT2 may extend in the third direction D3. The second under contact UCT2 may include a conductive material. For example, the second under contact UCT2 may include aluminum, copper, or tungsten.

A second conductive line CO2 may be provided in the first layer LA1. The second conductive line CO2 may be provided in the connection region COR. The second conductive line CO2 may be coupled to the second under contact UCT2. A lower surface of the second conductive line CO2 may be coupled to an upper surface of the second under contact UCT2. The second conductive line CO2 may include a conductive material. For example, the second conductive line CO2 may include aluminum, copper, or tungsten.

The first under contact UCT1 and the second under contact UCT2 may be disposed on the same level. In other words, the level of the upper surface of the first under contact UCT1 may be equal to the level of the upper surface of the second under contact UCT2. The level of the lower surface of the first under contact UCT1 may be equal to the level of the lower surface of the second under contact UCT2. The first conductive line Cal and the second conductive line CO2 may be disposed on the same level. In other words, the level of the upper surface of the first conductive line CO1 may be equal to the level of the upper surface of the second conductive line CO2. The level of the lower surface of the first conductive line Cal may be equal to the level of the lower surface of the second conductive line CO2.

A second layer LA2 may be provided on the first layer LA1. The second layer LA2 may cover the first conductive line CO1 and the second conductive line CO2. The second layer LA2 may include an insulating material different from that of the first layer LA1. For example, the second layer LA2 may include a nitride.

A third layer LA3 may be provided on the second layer LA2. The third layer LA3 may include an insulating material different from that of the second layer LA2. For example, the third layer LA3 may include an oxide.

A source structure SOS may be provided on the insulating structure IS. The source structure SOS may be provided in the cell region CER. The source structure SOS may have the shape of the plate extending along the plane that is defined by the first direction D1 and the second direction D2. The source structure SOS may be used as a source line coupled to a memory cell.

The source structure SOS may include a first source layer SOL1, a second source layer SOL2, and a third source layer SOL3 that are sequentially stacked in the third direction D3. The second source layer SOL2 may be provided between the first and third source layers SOL1 and SOL3. The first, second, and third source layers SOL1, SOL2, and SOL3 may be formed to have boundaries therebetween. Alternatively, the first, second, and third source layers SOL1, SOL2, and SOL3 may include the same material, so that they may be continuously formed without boundaries therebetween. Each of the first, second, and third source layers SOL1, SOL2, and SOL3 may include a conductive material. For example, each of the first, second and third source layers SOL1, SOL2, and SOL3 may include doped polysilicon.

The source structure SOS may be spaced apart from the first conductive line CO1. For example, the source structure SOS may be spaced apart from the first conductive line CO1 in the third direction D3. The second and third layers LA2 and LA3 of the insulating structure IS may be provided between the source structure SOS and the first conductive line CO1.

A first insulating layer 110 may be provided on the insulating structure IS. The first insulating layer 110 may be provided in the connection region COR. The first insulating layer 110 may be located on the same level as the source structure SOS. The first insulating layer 110 and the third layer LA3 of the insulating structure IS may be formed to have a boundary therebetween. Alternatively, the first insulating layer 110 and the third layer LA3 of the insulating structure IS may include the same material to be continuously formed without a boundary therebetween. The first insulating layer 110 may include an insulating material. For example, the first insulating layer 110 may include an oxide.

A second insulating layer 120 may be provided to cover the source structure SOS and the first insulating layer 110. The second insulating layer 120 may cover an upper surface of the source structure SOS and an upper surface of the first insulating layer 110. The second insulating layer 120 may include an insulating material. For example, the second insulating layer 120 may include an oxide.

A first contact CT1 may be provided to pass through the second and third layers LA2 and LA3 of the insulating structure IS, the source structure SOS, and the second insulating layer 120. For example, the first contact CT1 may extend in the third direction D3.

The first contact CT1 may be electrically coupled to the first conductive line CO1. A lower surface of the first contact CT1 may be in contact with an upper surface of the first conductive line CO1. The first contact CT1 may be electrically coupled to the source structure SOS. The first contact CT1 may pass through the second and third layers LA2 and LA3 of the insulating structure IS to electrically couple the source structure SOS and the first conductive line CO1 to each other. A level of the upper surface of the first contact CT1 may be higher than a level of the upper surface of the source structure SOS. The source structure SOS may be in contact with a side all of the first contact CT1, The source structure SOS may enclose the first contact CT1.

A width of the first contact CT1 may be reduced as the level is lowered. The width of the first contact CT1 may be reduced as it approaches the first conductive line CO1. For example, the width of the first contact CT1 in the first direction D1 may be reduced as it approaches the first conductive line CO1. The first contact CT1 may include a conductive material. For example, the first contact CT1 may include aluminum, copper, or tungsten.

The source structure SOS may be electrically coupled to the first impurity region IR1 in the substrate 100 by the first contact CT1, the first conductive line CO1, and the first under contact UCT1. Charges accumulated in the source structure SOS may be released to the first impurity region IR1 of the substrate 100 along the first contact CT1, the first conductive line CO1, and the first under contact UCT1, and the arcing of the source structure SOS may be mitigated or prevented.

A second contact CT2 may be provided to pass through the second and third layers LA2 and LA3 of the insulating structure IS, the first insulating layer 110, and the second insulating layer 120. For example, the second contact CT2 may extend in the third direction D3. The second contact CT2 may be electrically coupled to the second conductive line CO2. A lower surface of the second contact CT2 may be in contact with an upper surface of the second conductive line CO2. The first insulating layer 110 may be in contact with a sidewall of the second contact CT2. The first insulating layer 110 may enclose the second contact CT2. A width of the second contact CT2 may be reduced as the level is lowered. The width of the second contact CT2 may be reduced as it approaches the second conductive line CO2. For example, the width of the second contact CT2 in the first direction D1 may be reduced as it approaches the second conductive line CO2. The second contact CT2 may include a conductive material. For example, the second contact CT2 may include aluminum, copper, or tungsten.

A height of the second contact CT2 may be the same as a height of the first contact CT1. In other words, the shortest distance from the upper surface to the lower surface of the second contact CT2 may be the same as the shortest distance from the upper surface to the lower surface of the first contact CT1. A level at which the second contact CT2 is disposed may be the same as a level at which the first contact CT1 is disposed. In other words, the level of the upper surface of the second contact CT2 may be equal to the level of the upper surface of the first contact CT1. The level of the lower surface of the second contact CT2 may be equal to the level of the lower surface of the first contact CT1.

A first stack STA1 may be provided on the second insulating layer 120. The first stack STA1 may cover the first contact CT1, the second contact CT2, and the second insulating layer 120. The first stack STA1 may include a first stack part TP1 and a second stack part TP2. The first stack part TP1 may be a portion of the first stack STA1 provided in the cell region CER, The first stack part TP1 may cover the first contact CT1. The second stack part TP2 may be a portion of the first stack STA1 provided in the connection region COR. The second stack part TP2 may cover the second contact CT2.

The first stack part TP1 may include a plurality of conductive patterns CP and a plurality of insulating patterns IP. The conductive patterns CP and the insulating patterns IP of the first stack part TP1 may be alternately stacked in the third direction D3. The insulating patterns IP of the first stack part TP1 may include an insulating material. For example, the insulating patterns IP of the first stack part TP1 may include an oxide. The conductive patterns CP of the first stack part TP1 may include a conductive layer. The conductive layer may include a conductive material. For example, the conductive layer may include at least one of a doped silicon layer, a metal silicide layer, tungsten, nickel, and cobalt. The conductive layer may be used as a word line coupled to a memory cell or a select line coupled to a select transistor. The conductive patterns CP of the first stack part TP1 may further include a barrier layer that encloses the conductive layer. For example, the barrier layer may include at least one of titanium nitride and tantalum nitride.

The second stack part TP2 may include a plurality of sacrificial patterns SP and a plurality of insulating patterns IP. The sacrificial patterns SP and the insulating patterns IP of the second stack part TP2 may be alternately stacked in the third direction D3. The insulating patterns IP of the second stack part TP2 may include an insulating material. The insulating patterns IP of the second stack part TP2 and the insulating patterns IP of the first stack part TP1 may be disposed on the same level. The insulating patterns IP of the second stack part TP2 and the insulating patterns IP of the first stack part TP1 may be continuously formed without any boundary.

The sacrificial patterns SP of the second stack part TP2 may include a material different from that of the insulating patterns IP. For example, the sacrificial patterns SP of the second stack part TP2 may include a nitride. The sacrificial patterns SP of the second stack part TP2 and the conductive patterns CP of the first stack part TP1 may be disposed on the same level.

A second stack STA2 may be provided on the first stack STA1. The second stack STA2 may cover the first stack STA1. The second stack STA2 may include a third stack part TP3 and a fourth stack part TP4. The third stack part TP3 may be a portion of the second stack STA2 provided in the cell region CER. The third stack part TP3 may cover the first stack part TP1, The fourth stack part TP4 may be a portion of the second stack STA2 provided in the connection region COR. The fourth stack part TP4 may cover the second stack part TP2, The fourth stack part TP4 may cover a third contact CT3 that will be described later.

The third stack part TP3 may include a plurality of conductive patterns CP and a plurality of insulating patterns IR The conductive patterns CP and the insulating patterns IP of the third stack part TP3 may be similar to the conductive patterns CP and the insulating patterns IP of the first stack part TP1.

The fourth stack part TP4 may include a plurality of sacrificial patterns SP and a plurality of insulating patterns IR The sacrificial patterns SP and the insulating patterns IP of the fourth stack part TP4 may be similar to the sacrificial patterns SP and the insulating patterns IP of the second stack part TP2.

A level of a boundary between the first and second stacks STA1 and STA2 may be defined as a first level LV1. A level of a boundary between the first and third stack parts TP1 and TP3 may be the same as the first level LV1. A level of a boundary between the second and fourth stack parts TP2 and TP4 may be the same as the first level LV1.

The first level LV1 may be the same as the level of an upper surface IPUT1 of an uppermost insulating pattern IPU1 of the first stack part TP1. The first level LV1 may be the same as the level of a lower surface CPLB of a lowermost conductive pattern CPL of the third stack part TP3. The first level LV1 may be the same as the level of an upper surface IPUT2 of an uppermost insulating pattern IPU2 of the second stack part TP2. The first level LV1 may be the same as the level of a lower surface SPLB of a lowermost sacrificial pattern SPL of the fourth stack part TP4.

Channel structures CS may be provided to pass through the second insulating layer 120, the first stack STA1, and the second stack STA2. For example, the channel structures CS may extend in the third direction D3. The channel structures CS may pass through the first and third stack parts TP1 and TP3. The channel structures CS may pass through the conductive patterns CP and the insulating patterns IR The conductive patterns CP and the insulating patterns IP may enclose the channel structures CS. A lowermost portion of the channel structure CS may be located in the source structure SOS. The lowermost portion of the channel structure CS may be located in a first source layer SOL1 of the source structure SOS.

The channel structure CS may include a filling layer FI, a channel layer CL, and a capping layer CAP. The filling layer FI may pass through the second insulating layer 120, the first stack STA1, and the second stack STA2. The channel layer CL may enclose the filling layer FI. The channel layer CL may be in contact with a sidewall and a lower surface of the filling layer FI. The filling layer FI may be provided in the channel layer CL. The channel layer CL may be in contact with the source structure SOS. The channel layer CL may be in contact with a second source layer SOL2 of the source structure SOS. The capping layer CAP may be provided on the filling layer FI. The capping layer CAP may be enclosed by the channel layer CL.

The filling layer FI may include an insulating material. For example, the filling layer FI may include an oxide. The channel layer CL may include a semiconductor material. For example, the channel layer CL may include polysilicon. The capping layer CAP may include a conductive material. For example, the capping layer CAP may include polysilicon.

First memory layers ML1 and second memory layers ML2 may be provided to enclose the channel structure CS. The first memory layer ML1 may enclose a middle portion and an upper portion of the channel structure CS. The second memory layer ML2 may enclose a lowermost portion of the channel structure CS. The first memory layer ML1 may pass through the first stack STA1 and the second stack STA2. The first memory layer ML1 may pass through the first stack part TP1 and the third stack part TP3.

The first and second memory layers ML1 and ML2 may be spaced apart from each other. A portion of the second source layer SOL2 of the source structure SOS may be provided between the first and second memory layers ML1 and ML2. The portion of the second source layer SOL2 of the source structure SOS may be in contact with the channel layer CL. The second memory layer ML2 may be provided in the first source layer SOL1 of the source structure SOS.

The first memory layer ML1 may include a tunnel insulating layer TL enclosing the channel layer CL, a data storage layer DL enclosing the tunnel insulating layer TL, and a blocking layer BKL enclosing the data storage layer DL. The tunnel insulating layer TL may include a material making charge tunneling possible. For example, the tunnel insulating layer TL may include an oxide. For example, the data storage layer DL may include a nitride that may trap a charge. The material included in the data storage layer DL may be variously changed according to a data storage method, without being limited to the nitride. For example, the data storage layer DL may include silicon, a phase-change material, or nanodots. The blocking layer BKL may include a material that may block the movement of charges. For example, the blocking layer BKL may include an oxide.

Similarly to the first memory layer ML1, the second memory layer ML2 may include a tunnel insulating layer TL, a data storage layer DL, and a blocking layer BKL.

The first memory layer ML1 may include a first memory part ML1a, a second memory part ML1b, and a third memory part ML1c. The first memory part ML1a may pass through the second stack STA2. The first memory part ML1a may pass through the third stack part TP3. The second memory part ML1b may pass through the first stack STA1. The second memory part ML1b may pass through the first stack part TP1. The third memory part ML1c may couple the first memory part ML1a and the second memory part ML1b to each other. The third memory part ML1c may be coupled to a lowermost portion of the first memory part ML1a and an uppermost portion of the second memory part ML1b.

An upper surface ML1cT of the third memory part ML1c may be in contact with the lower surface of the second stack STA2. The upper surface ML1cT of the third memory part ML1c may be in contact with the lower surface CPLB of the lowermost conductive pattern CPL of the third stack part TP3 of the second stack STA2. The upper surface ML1cT of the third memory part ML1c that is in contact with the lower surface CPLB of the lowermost conductive pattern CPL of the third stack part TP3 of the second stack STA2 may be a portion of a surface of the blocking layer BKL. A level of the upper surface ML1cT of the third memory part ML1c may be the same as the first level LV1.

The third contact CT3 may be provided to pass through the first stack STA1. For example, the third contact CT3 may extend in the third direction D3. The third contact CT3 may pass through the second stack part TP2. The third contact CT3 may pass through the sacrificial patterns SP and the insulating patterns IP of the second stack part TP2 of the first stack STA1. The sacrificial patterns SP and the insulating patterns IP may enclose the third contact CT3. The third contact CT3 may be electrically coupled to the second contact CT2. The second contact CT2 may couple the third contact CT3 and the second conductive line CO2 to each other. A lower surface of the third contact CT3 may be in contact with an upper surface of the second contact CT2. A width of the upper surface of the second contact CT2 may be greater than a width of the lower surface of the third contact CT3. For example, a width of the upper surface of the second contact CT2 in the first direction D1 may be greater than a width of the lower surface of the third contact CT3 in the first direction D1.

A width of the third contact CT3 may be reduced as the level is lowered. The width of the third contact CT3 may be reduced as it approaches the second contact CT2. For example, the width of the third contact CT3 in the first direction D1 may be reduced as it approaches the second contact CT2. The third contact CT3 may include a conductive material. For example, the third contact CT3 may include aluminum, copper, or tungsten.

A fourth contact CT4 may be provided to pass through the second stack STA2. For example, the fourth contact CT4 may extend in the third direction D3. The fourth contact CT4 may pass through the fourth stack part TP4. The fourth contact CT4 may pass through the sacrificial patterns SP and the insulating patterns IP of the fourth stack part TP4 of the second stack STA2. The sacrificial patterns SP and the insulating patterns IP of the fourth stack part TP4 of the second stack STA2 may enclose the fourth contact CT4. The fourth contact CT4 may be electrically coupled to the third contact CT3. The third contact CT3 may couple the fourth contact CT4 and the second contact CT2 to each other. A lower surface CT4B of the fourth contact CT4 may be in contact with an upper surface CT3T of the third contact CT3. A width of the upper surface CT3T of the third contact CT3 may be greater than a width of a lower surface CT4B of the fourth contact CT4. For example, a width of the upper surface CT3T of the third contact CT3 in the first direction D1 may be greater than a width of the lower surface CT4B of the fourth contact CT4 in the first direction D1.

A width of the fourth contact CT4 may be reduced as the level is lowered. The width of the fourth contact CT4 may be reduced as it approaches the third contact CT3. For example, the width of the fourth contact CT4 in the first direction D1 may be reduced as it approaches the third contact CT3. The fourth contact CT4 may include a conductive material. For example, the fourth contact CT4 may include aluminum, copper, or tungsten.

A level of a boundary between the third and fourth contacts CT3 and CT4 may be the same as the first level LV1. A level of the upper surface CT3T of the third contact CT3 and a level of the lower surface CT4B of the fourth contact CT4 may be the same as the first level LV1. A portion of the upper surface CT3T of the third contact CT3 may be in contact with the lower surface of the second stack STA2. A portion of the upper surface CT3T of the third contact CT3 may be in contact with the lower surface SPLB of the lowermost sacrificial pattern SPL of the fourth stack part TP4 of the second stack STA2.

A sum of heights of the second to fourth contacts CT2, CT3, and CT4 may be greater than a height of the channel structure CS. In other words, the shortest distance from the lower surface of the second contact CT2 to the upper surface of the fourth contact CT4 may be greater than the shortest distance from the lower surface to the upper surface of the channel structure CS.

A sum of heights of the third and fourth contacts CT3 and CT4 may be smaller than the height of the channel structure CS. In other words, the shortest distance from the lower surface of the third contact CT3 to the upper surface of the fourth contact CT4 may be smaller than the shortest distance from the lower surface to the upper surface of the channel structure CS.

A third insulating layer 130 may be provided on the second stack STA2. The third insulating layer 130 may cover the channel structure CS and the fourth contact CT4. The third insulating layer 130 may include an insulating material. For example, the third insulating layer 130 may include an oxide.

Fifth contacts CT5 and a sixth contact CT6 may be provided to pass through the third insulating layer 130. Each of the fifth contacts CT5 may be coupled to each of the channel structures CS. A sixth contact CT6 may be coupled to the fourth contact CT4. The fifth contact CT5 and the sixth contact CT6 may extend in the third direction D3. The fifth contact CT5 and the sixth contact CT6 may include a conductive material. For example, the fifth and sixth contacts CT5 and CT6 may include aluminum, copper, or tungsten.

A fourth insulating layer 140 may be provided on the third insulating layer 130. The fourth insulating layer 130 may cover the fifth and sixth contacts CT5 and CT6. The fourth insulating layer 140 may include an insulating material. For example, the fourth insulating layer 140 may include an oxide.

Third conductive lines CO3 and a fourth conductive line CO4 may be provided to pass through the fourth insulating layer 140. Each of the third conductive lines CO3 and each of the fifth contacts CT5 may be coupled to each other. The third conductive line CO3 may be a bit line. The fourth conductive line CO4 may be coupled to the sixth contact CT6. The third and fourth conductive lines CO3 and CO4 may include conductive material. For example, the third and fourth conductive lines CO3 and CO4 may include aluminum, copper, or tungsten.

The semiconductor device according to this embodiment may be configured such that the plurality of contacts CT2, CT3, and CT4 coupled to the peripheral transistor TR is formed to pass through the first insulating layer 110, the first stack STA1, and the second stack STA2. Thus, each of the second, third, and fourth contacts CT2, CT3, and CT4 may be relatively lower in height. Thus, the width of the lower surface of each of the second, third, and fourth contacts CT2, CT3, and CT4 may be sufficiently secured, thus preventing the second conductive line CO2 and the second, third, and fourth contacts CT2, CT3, and CT4 from being separated from each other, and improving resistance between the second conductive line CO2 and the second, third, and fourth contacts CT2, CT3, and CT4. Furthermore, the bending characteristics of each of the second, third, and fourth contacts CT2, CT3, and CT4 may be improved, thus preventing the second, third, and fourth contacts CT2, CT3, and CT4 from being in contact with other contacts.

FIGS. 2A, 2B, 2C, 2D, 2E, 2F, 2G, 2H, and 2I are sectional views illustrating a method of manufacturing the semiconductor device of FIGS. 1A to 1C.

For the sake of brevity, the same reference numerals are used for the components described with reference to FIGS. 1A to 1C, and a duplicated description will be omitted herein.

The manufacturing method described below is one possible embodiment of the method for manufacturing the semiconductor device of FIGS. 1A to 1C. The method for manufacturing the semiconductor device of FIGS. 1A to 1C is not limited to the manufacturing method that is described below.

Figure 2A:
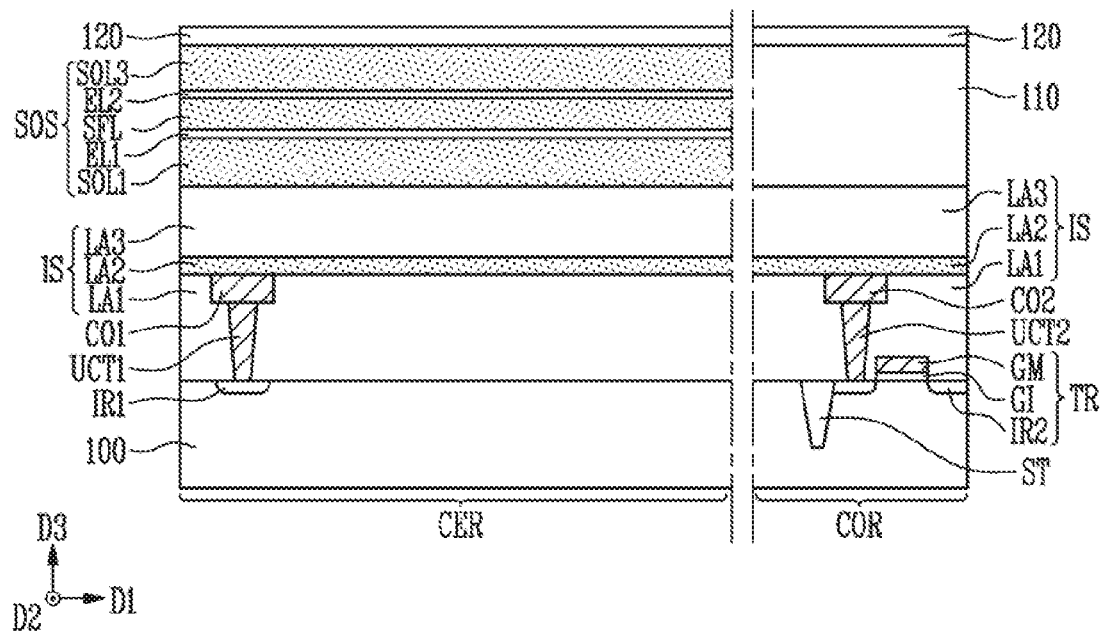
FIGS. 2A, 2B, 2C, 2D, 2E, 2F, 2G, 2H, and 2I are sectional views illustrating a method of manufacturing the semiconductor device of FIGS. 1A to 1C.

Referring to FIG. 2A, the element separation layer ST and the first impurity region IR1 may be formed in the substrate 100, and the peripheral transistor TR may be formed on the substrate 100.

Subsequently, the insulating structure IS, the first and second under contacts UCT1 and UCT2, and the first and second conductive lines Ca1 and CO2 may be formed on the substrate 100. The formation of the insulating structure IS, the first and second under contacts UCT1 and UCT2, and the first and second conductive lines CO1 and CO2 may include the formation of the first layer LA1, the formation of the first and second under contacts UCT1 and UCT2 and the first and second conductive lines CO1 and CO2, the formation of the second layer LA2, and the formation of the third layer LA3.

The source structure SOS and the first insulating layer 110 may be formed on the insulating structure IS. The source structure SOS may be formed in the cell region CER, and the first insulating layer 110 may be formed in the connection region COR.

The source structure SOS may include the first source layer SOL1, a first etching stop layer EL1, a source sacrificial layer SFL, a second etching stop layer EL2, and the third source layer SOL3 that are sequentially stacked in the third direction D3. The source structure SOS may be formed by sequentially forming the first source layer SOL1, the first etching stop layer EL1, the source sacrificial layer SFL, the second etching stop layer EL2, and the third source layer SOL3.

Each of the first source layer SOL1, the source sacrificial layer SFL, and the third source layer SOL3 may include a semiconductor material. For example, each of the first source layer SOL1, the source sacrificial layer SFL, and the third source layer SOL3 may include polysilicon. Each of the first etching stop layer ELI and the second etching stop layer EL2 may include a material having etch selectivity to the first source layer SOL1, the source sacrificial layer SFL, and the third source layer SOL3. For example, each of the first etching stop layer EL1 and the second etching stop layer EL2 may include an oxide.

The first insulating layer 110 may be formed after the third layer LA3 of the insulating structure IS has been formed. Alternatively, the first insulating layer 110 may be formed simultaneously with the third layer LA3 of the insulating structure IS. When the first insulating layer 110 is formed after the third layer LA3 of the insulating structure IS has been formed, the boundary may be formed between the third layer LA3 of the insulating structure IS and the first insulating layer 110. When the first insulating layer 110 is formed simultaneously with the third layer LA3 of the insulating structure IS, the third layer LA3 of the insulating structure IS and the first insulating layer 110 may be continuously formed without any boundary therebetween. When the first insulating layer 110 is formed simultaneously with the third layer LA3 of the insulating structure IS, the source structure SOS may be formed in an empty space that is formed by removing a portion of the first insulating layer 110.

The source structure SOS and the first insulating layer 110 may be formed on the same level. The second insulating layer 120 may be formed on the source structure SOS and the first insulating layer 110.

Figure 2B:
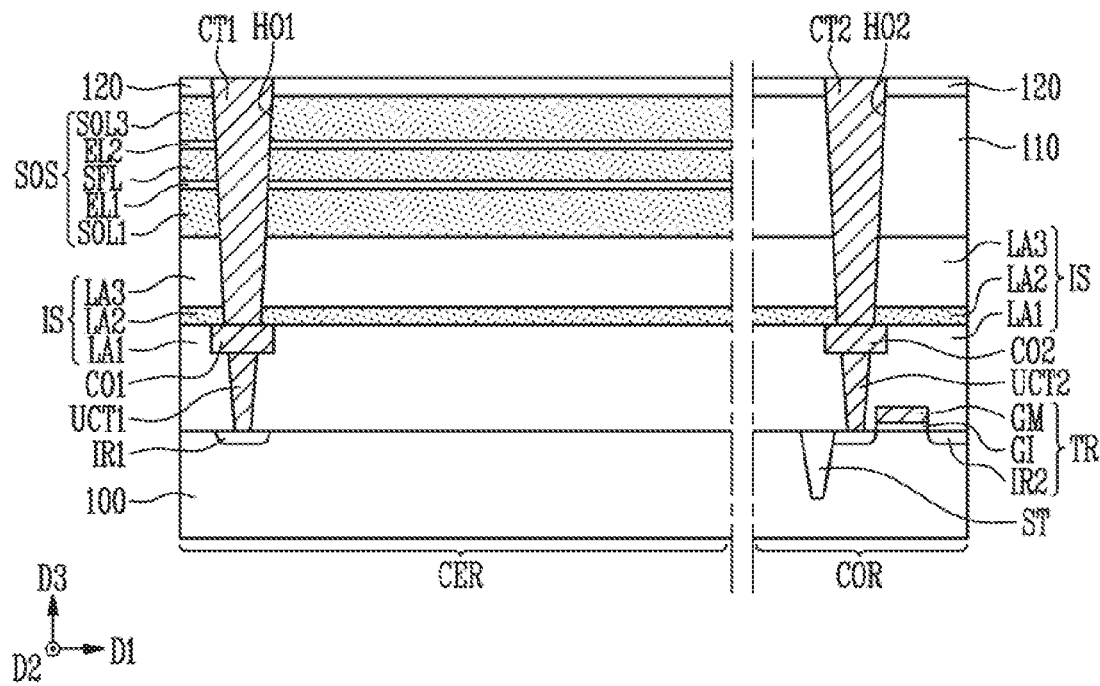

Referring to FIG. 2B, the first contact CT1 may be formed to pass through the second and third layers LA2 and LA3 of the insulating structure IS, the source structure SOS, and the second insulating layer 120. The formation of the first contact CT1 may include the formation of a first hole HO1 passing through the second and third layers LA2 and LA3 of the insulating structure IS, the source structure SOS, and the second insulating layer 120, and the formation of the first contact CT1 in the first hole HO1. The first contact CT1 may pass through the second and third layers LA2 and LA3 of the insulating structure IS to couple the source structure SOS and the first conductive line CO1.

The second contact CT2 may be formed to pass through the second and third layers LA2 and LA3 of the insulating structure IS, the first insulating layer 110, and the second insulating layer 120. The formation of the second contact CT2 may include the formation of a second hole HO2 passing through the second and third layers LA2 and LA3 of the insulating structure IS, the first insulating layer 110, and the second insulating layer 120, and the formation of the second contact CT2 in the second hole HO2. The second contact CT2 may pass through the second and third layers LA2 and LA3 of the insulating structure IS, the first insulating layer 110, and the second insulating layer 120 to be coupled to the second conductive line CO2.

In an embodiment, the first and second contacts CT1 and CT2 may be simultaneously formed. In detail, the first and second holes HO1 and HO2 may be simultaneously formed, and the first contact CT1 in the first hole HO1 and the second contact CT2 in the second hole HO2 may be simultaneously formed.

In another embodiment, the first and second contacts CT1 and CT2 may be formed at different times.

Figure 2C:
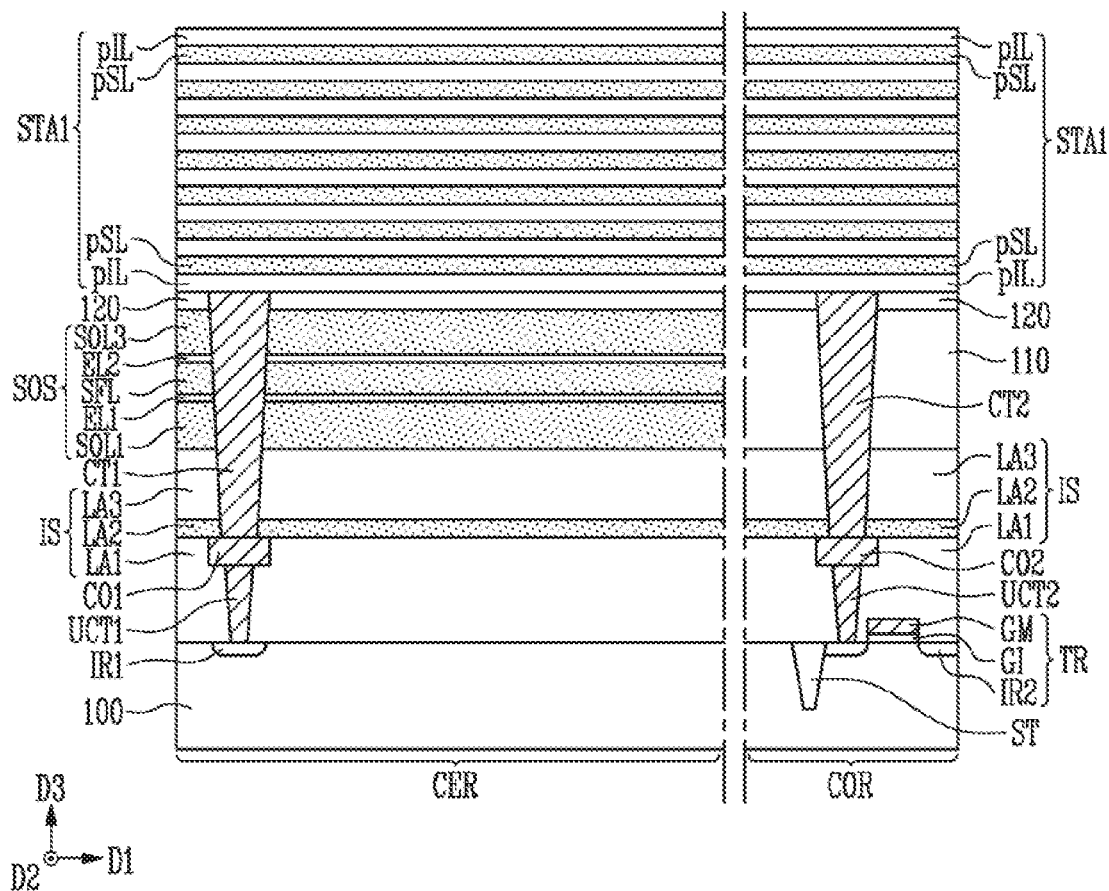

Referring to FIG. 2C, the first stack STA1 may be formed on the second insulating layer 120. The first stack STA1 may include preliminary insulating layers pIL and preliminary sacrificial layers pSL that are sequentially stacked in the third direction D3. The first stack STA1 may cover the first contact CT1 and the second contact CT2. The first stack STA1 may cover the upper surface of the first contact CT1 and the upper surface of the second contact CT2.

The preliminary insulating layers pIL may include an insulating material. For example, the preliminary insulating layers pIL may include an oxide. The preliminary sacrificial layers pSL may include a material different from that of the preliminary insulating layers pIL. For example, the preliminary sacrificial layers pSL may include a nitride.

Figure 2D:
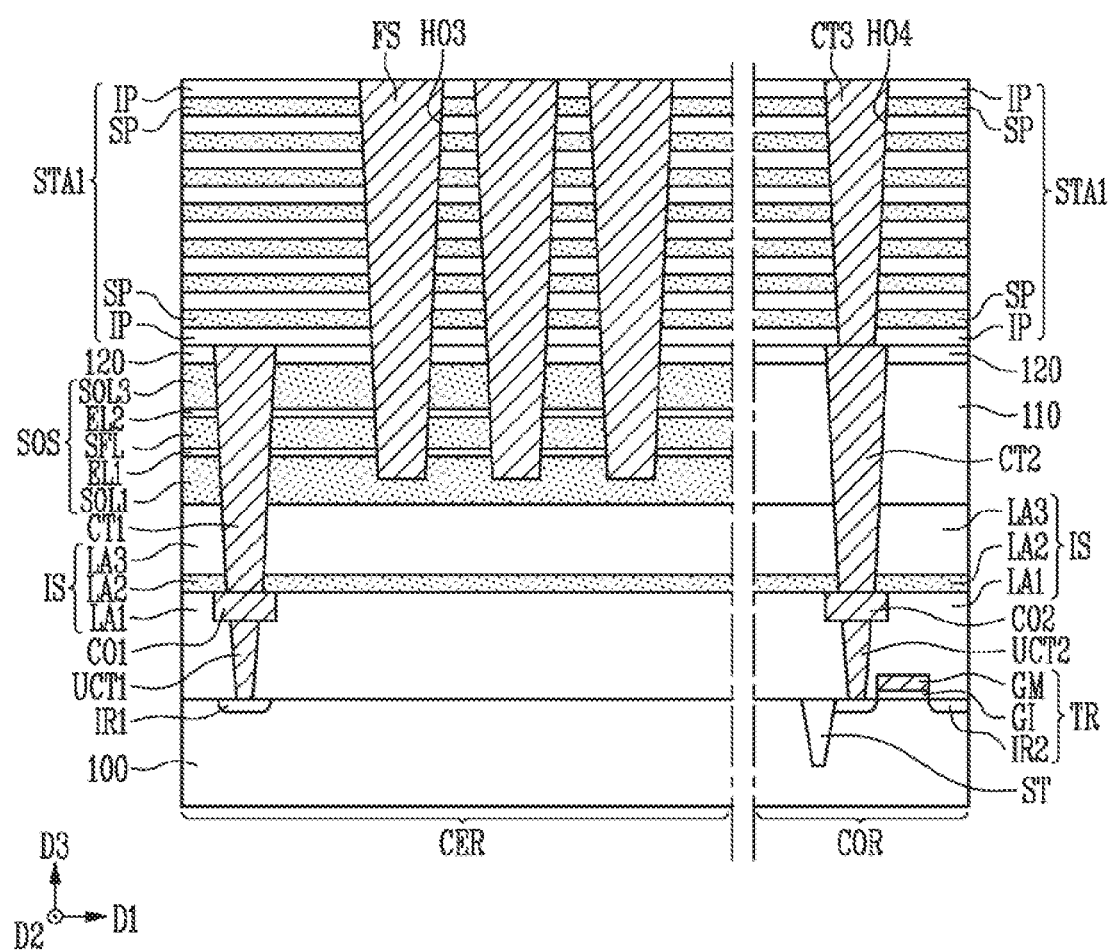

Referring to FIG. 2D, sacrificial structures FS may be formed to pass through the first stack STA1, the second insulating layer 120, and a portion of the source structure SOS. The sacrificial structure FS may pass through the first and second etching stop layers EL1 and EL2, the source sacrificial layer SFL, and the third source layer SOL3 of the source structure SOS. A lowermost portion of the sacrificial structure FS may be located in the first source layer SOL1. The sacrificial structure FS may pass through the preliminary sacrificial layers pSL and the preliminary insulating layers pIL of the first stack STA1. The preliminary sacrificial layers pSL and the preliminary insulating layers pIL of the first stack STA1 may enclose the sacrificial structure FS.

The formation of the sacrificial structure FS may include the formation of a third hole HO3 passing through the first stack STA1, the second insulating layer 120, and a portion of the source structure SOS, and the formation of the sacrificial structure FS in the third hole HO3. The sacrificial structure FS may include a material having etch selectivity to the preliminary insulating layer pIL and the preliminary sacrificial layer pSL. For example, the sacrificial structure FS may include tungsten.

The third contact CT3 may be formed to pass through the first stack STA1. The third contact CT3 may pass through the preliminary sacrificial layers pSL and the preliminary insulating layers pIL of the first stack STA1. The preliminary sacrificial layers pSL and the preliminary insulating layers pIL of the first stack STA1 may enclose the third contact CT3. The third contact CT3 may pass through the first stack STA1 to be coupled to the second contact CT2.

The formation of the third contact CT3 may include the formation of a fourth hole HO4 passing through the first stack STA1, and the formation of the third contact CT3 in the fourth hole HO4.

A height of the sacrificial structure FS may be greater than a height of the third contact CT3. In other words, the shortest distance from the lower surface to the upper surface of the sacrificial structure FS may be greater than the shortest distance from the lower surface to the upper surface of the third contact CT3. A level of the upper surface of the sacrificial structure FS may be the same as a level of the upper surface of the third contact CT3.

In an embodiment, the sacrificial structures FS and the third contact CT3 may be simultaneously formed. In detail, the third holes HO3 and the fourth hole 1104 may be simultaneously formed, and the sacrificial structure FS in the third holes HO3 and the third contact CT3 in the fourth hole HO4 may be simultaneously formed.

In another embodiment, the sacrificial structures FS and the third contact CT3 may be formed at different times.

While the sacrificial structures FS and the third contact CT3 are formed, the preliminary insulating layers pIL of the patterned first stack STA1 may be defined as insulating patterns IR While the sacrificial structures FS and the third contact CT3 are formed, the preliminary sacrificial layers pSL of the patterned first stack STA1 may be defined as sacrificial patterns SP.

Figure 2E:
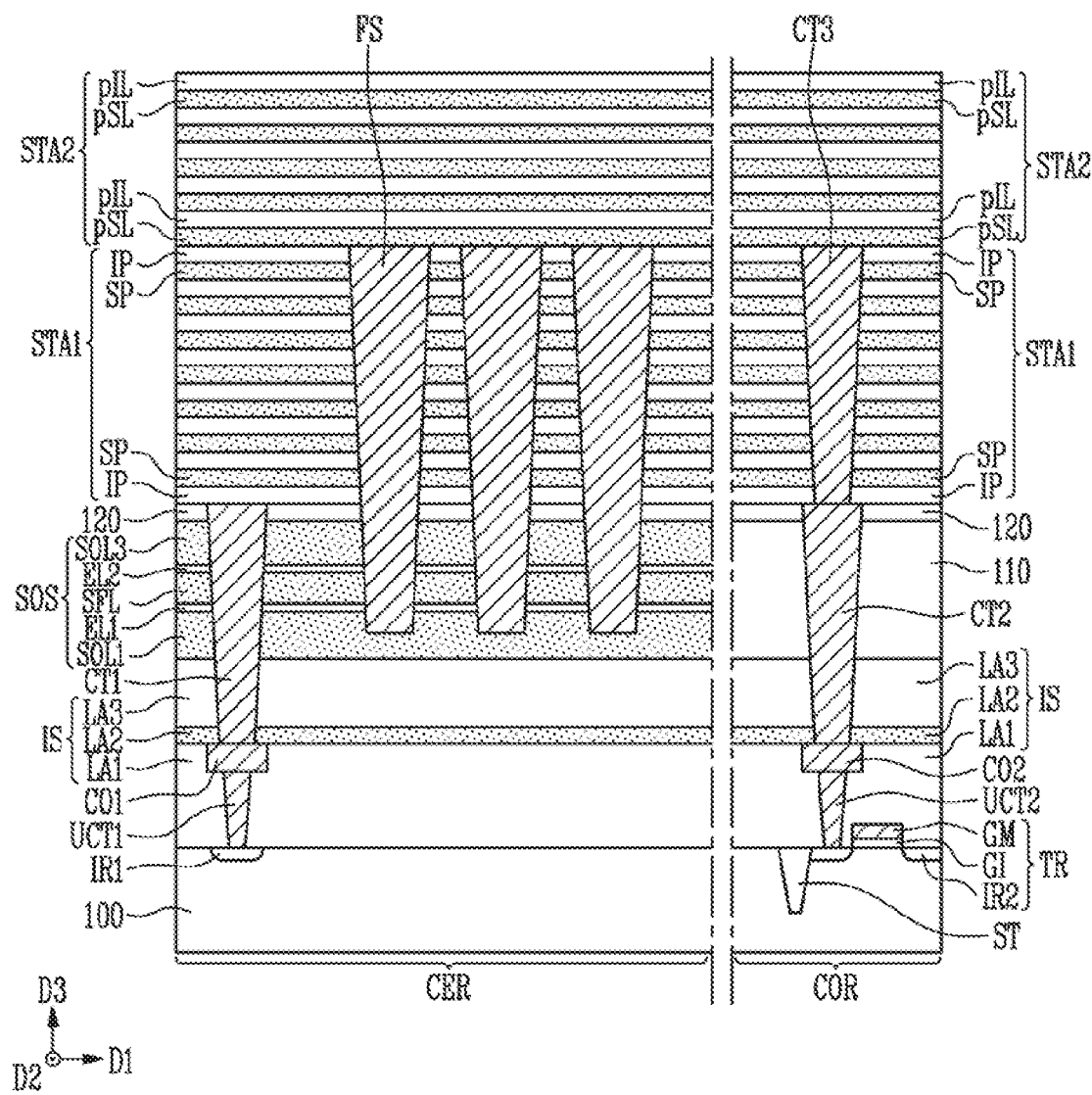

Referring to FIG. 2E, the second stack STA2 may be formed on the first stack STA1. The second stack STA2 may include preliminary insulating layers pIL and preliminary sacrificial layers pSL that are sequentially stacked in the third direction D3. The second stack STA2 may cover the sacrificial structures FS and the third contact CT3. The second stack STA2 may cover the upper surfaces of the sacrificial structures FS and the upper surface of the third contact CT3.

Figure 2F:
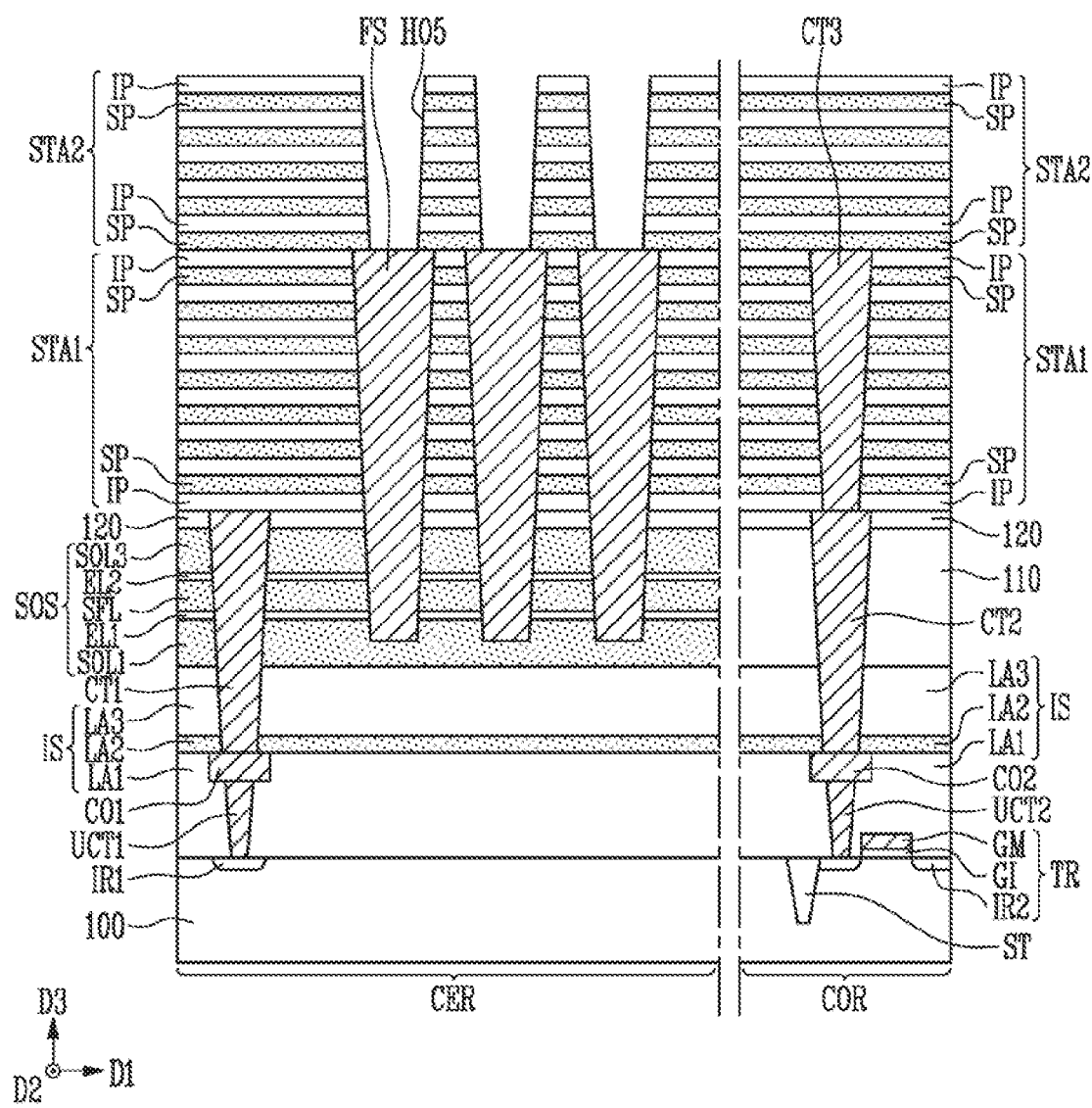

Referring to FIG. 2F, fifth holes HO5 may be formed to pass through the second stack STA2. Each fifth hole HO5 may overlap a sacrificial structure FS. The fifth hole 1105 may be formed to expose the sacrificial structure FS. The fifth hole 1105 may be formed to expose a portion of the upper surface of the sacrificial structure FS. A width of a lower surface of the fifth hole 1105 may be smaller than a width of the upper surface of the sacrificial structure FS. For example, a width of the lower surface of the fifth hole HO5 in the first direction D1 may be smaller than a width of the upper surface of the sacrificial structure FS in the first direction D1.

While the fifth holes HO5 are formed, the preliminary insulating layers pIL of the patterned second stack STA2 may be defined as insulating patterns IP. While the fifth holes HO5 are formed, the preliminary sacrificial layers pSL of the patterned second stack STA2 may be defined as sacrificial patterns SP.

Figure 2G:
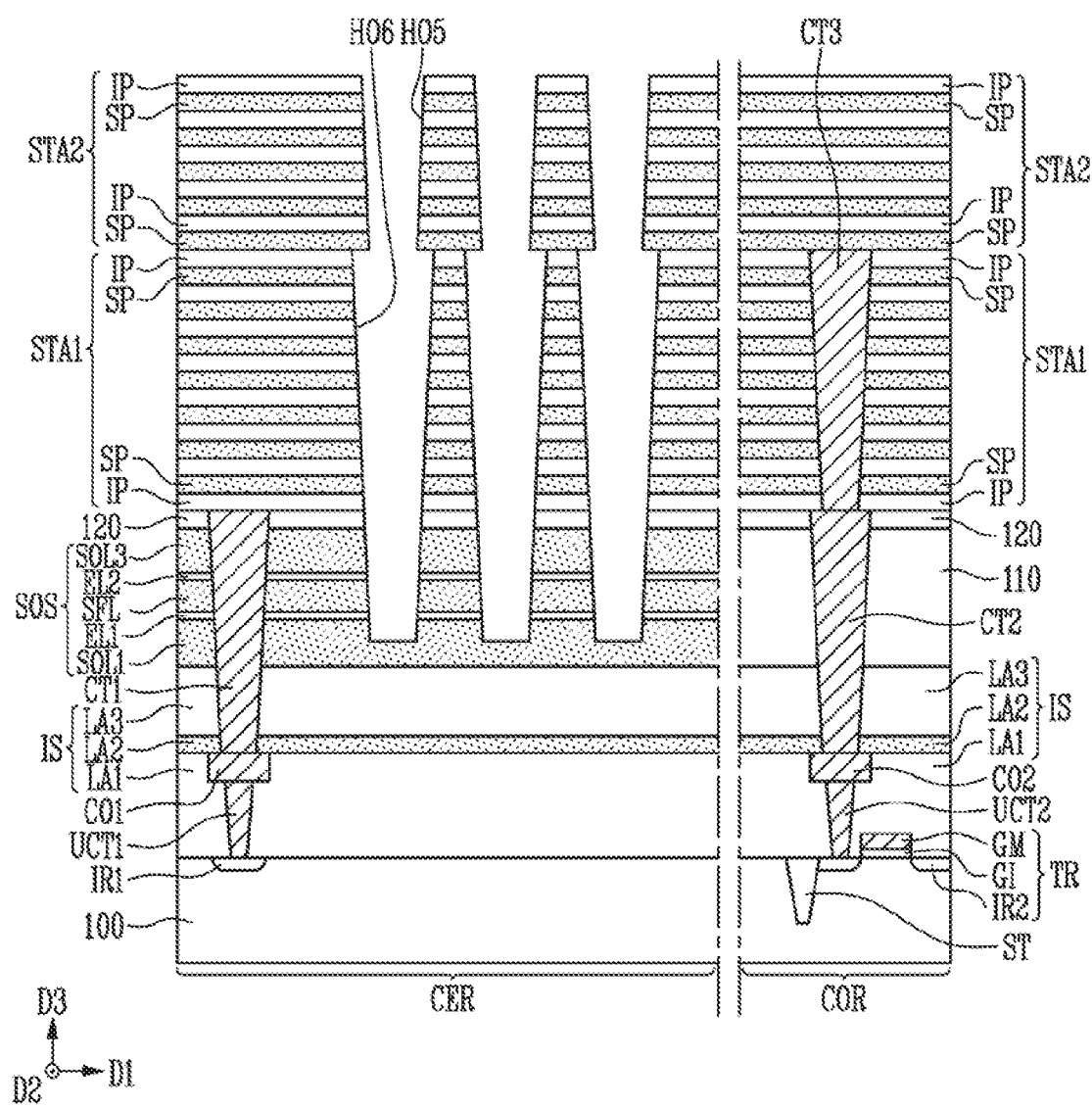

Referring to FIG. 2G, sixth holes HO6 may be formed by removing the sacrificial structures FS. Empty spaces formed by removing the sacrificial structures FS may be defined as the sixth holes HO6. The sixth holes HO6 may pass through the first stack STA1. The sixth holes HO6 may align with or be overlapped by the fifth holes HO5. The sixth holes HO6 may pass through the first stack STA1, the second insulating layer 120, and a portion of the source structure SOS.

Figure 2H:
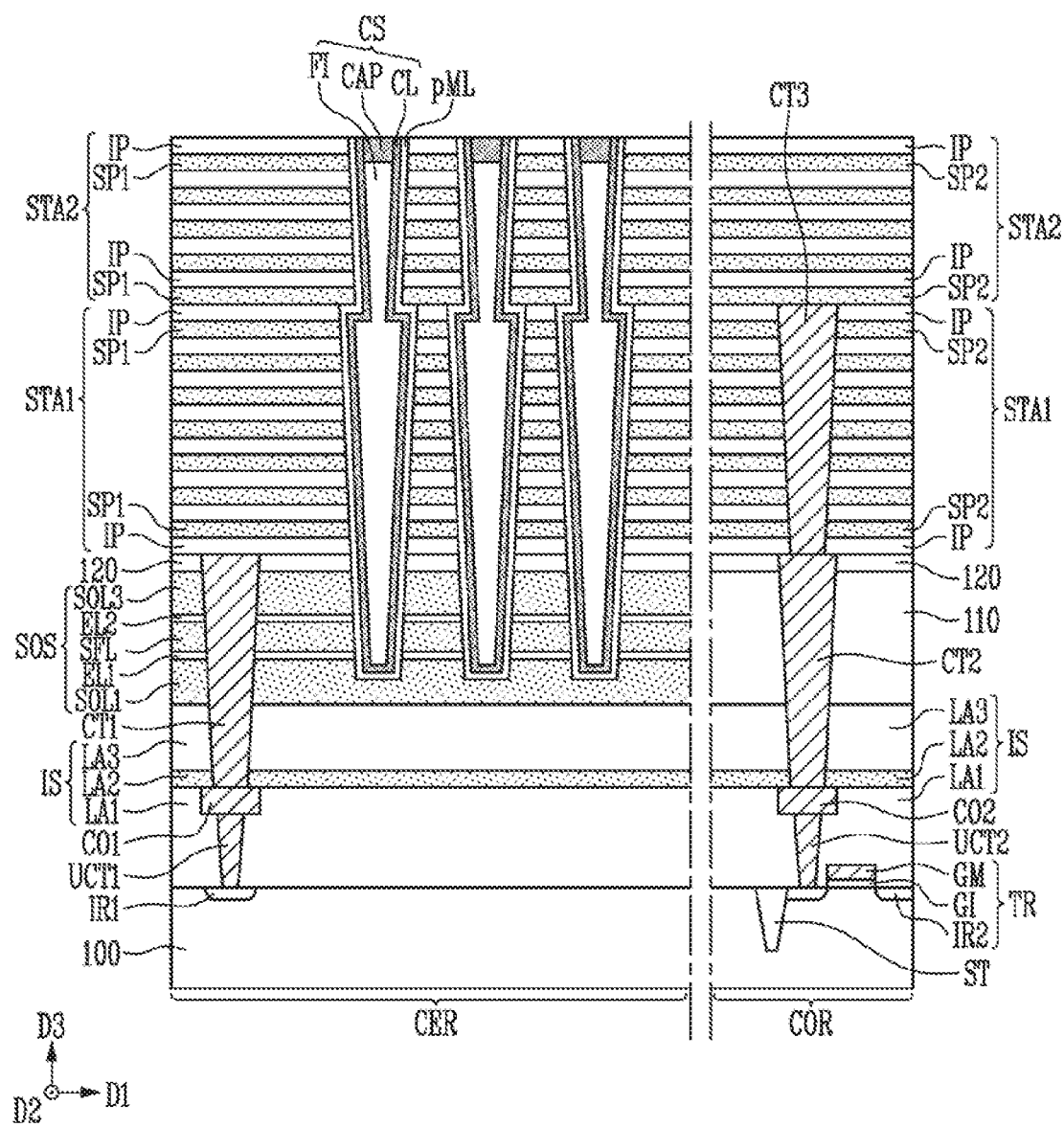

Referring to FIG. 2H, a channel structure CS and a preliminary memory layer pML may be formed in the fifth and sixth holes HO5 and HO6. The channel structure CS and the preliminary memory layer pML may pass through the first and second stacks STA1 and STA2. The preliminary memory layer pML may include a preliminary tunnel insulating layer, a preliminary data storage layer, and a preliminary blocking layer.

The formation of the channel structure CS and the preliminary memory layer pML may include the formation of the preliminary memory layer pML on sidewalls of the fifth and sixth holes HO5 and HO6, the formation of the channel layer CL in the preliminary memory layer pML, and the formation of the filling layer FI and the capping layer CAP in the channel layer CL.

Each of the sacrificial patterns SP of the first and second stacks STA1 and STA2 may include a first portion SP1 and a second portion SP2. The first portion SP1 may be a portion that is disposed in the cell region CER. The second portion SP2 may be a portion that is disposed in the connection region COR. The first portions SP1 of the sacrificial patterns SP of the first and second stacks STA1 and STA2 may enclose the channel structure CS. The second portions SP2 of the sacrificial patterns SP of the first stack STA1 may enclose the third contact CT3.

Figure 2I:
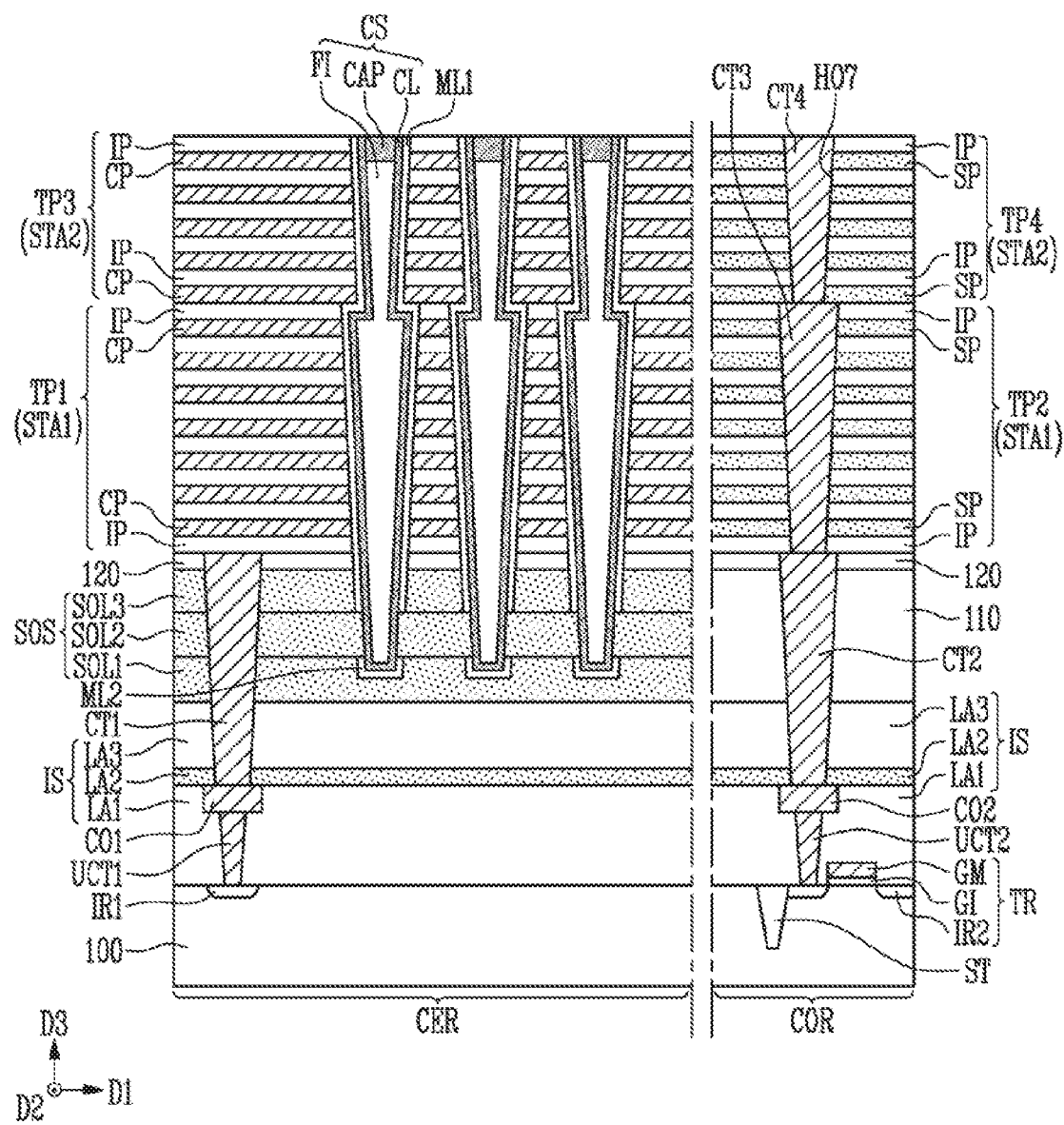

Referring to FIG. 2I, the first portion SP1 of each of the sacrificial patterns SP of the first and second stacks STA1 and STA2 may be replaced with a conductive pattern CR The second portion SP2 of each of the sacrificial patterns SP of the first and second stacks STA1 and STA2 may remain without being replaced with the conductive pattern CP.

The first portion SP1 of each of the sacrificial patterns SP of the first and second stacks STA1 and STA2 may be replaced with the conductive pattern CP to form the first to fourth stack parts TP1, TP2, TP3, and TP4. A portion of the first stack STA1 in the cell region CER may be defined as the first stack part TP1. A portion of the first stack STA1 in the connection region COR may be defined as the second stack part TP2. A portion of the second stack STA2 in the cell region CER may be defined as the third stack part TP3. A portion of the second stack STA2 in the connection region COR may be defined as the fourth stack part TP4. The first and third stack parts TP1 and TP3 may include conductive patterns CP and insulating patterns IP. The second and fourth stack parts TP2 and TP4 may include sacrificial patterns SP and insulating patterns IP.

The replacement of the first portion SP1 of each of the sacrificial patterns SP of the first and second stacks STA1 and STA2 with the conductive pattern CP may include the formation of slits passing through the first and second stacks STA1 and STA2, the removal of the first portion SP1 of each of the sacrificial patterns SP of the first and second stacks STA1 and STA2 through the slit, and the formation of the conductive pattern CP in a space formed by removing the first portion SP1 of each of the sacrificial patterns SP of the first and second stacks STA1 and STA2.

The remaining second portion SP2 of each of the sacrificial patterns SP of the first and second stacks STA1 and STA2 may be defined as the sacrificial pattern SP of the second stack part TP2 or the fourth stack part TP4.

The first etching stop layer EL1, the second etching stop layer EL2, and the source sacrificial layer SFL of the source structure SOS may be replaced with the second source layer SOL2. The replacement of the first etching stop layer EL1, the second etching stop layer EL2, and the source sacrificial layer SFL with the second source layer SOL2 may include the removal of the source sacrificial layer SFL, the first etching stop layer EL1, and the second etching stop layer EL2 through the slit, and the formation of the second source layer SOL2 in a space formed by removing the source sacrificial layer SFL, the first etching stop layer EL1, and the second etching stop layer EL2.

While the source sacrificial layer SFL, the first etching stop layer EL1, and the second etching stop layer EL2 are removed, a portion of the preliminary memory layer pML may also be removed. As a portion of the preliminary memory layer pML is removed, the preliminary memory layer pML may be divided into first and second memory layers ML1 and ML2. A surface of the channel layer CL may be exposed between the first and second memory layers ML1 and ML2. The second source layer SOL2 may be formed such that the exposed surface of the channel layer CL and the second source layer SOL2 come into contact with each other.

The fourth contact CT4 may be formed to pass through the second stack STA2. The fourth contact CT4 may pass through the sacrificial patterns SP and the insulating patterns IP of the fourth stack part TP4 of the second stack STA2. The sacrificial patterns SP and the insulating patterns IP of the fourth stack part TP4 of the second stack STA2 may enclose the fourth contact CT4. The fourth contact CT4 may pass through the fourth stack part TP4 of the second stack STA2 to be coupled to the third contact CT3.

The formation of the fourth contact CT4 may include the formation of a seventh hole HO7 passing through the fourth stack part TP4 of the second stack STA2, and the formation of the fourth contact CT4 in the seventh hole HO7.

Subsequently, the third insulating layer 130 and the fifth and sixth contacts CT5 and CT6 passing through the third insulating layer 130 may be formed (see FIG. 1A). Subsequently, the fourth insulating layer 140 and the third and fourth conductive lines CO3 and CO4 passing through the fourth insulating layer 140 may be formed (see FIG. 1A).

The method of manufacturing the semiconductor device according to this embodiment may be configured such that the plurality of contacts CT2, CT3, and CT4 coupled to the peripheral transistor TR is formed to pass through the first insulating layer 110, the first stack STA1, and the second stack STA2. Thus, each of the second, third, and fourth contacts CT2, CT3, and CT4 may be relatively lower in height. Thus, the width of the lower surface of each of the second, third, and fourth contacts CT2, CT3, and CT4 may be sufficiently secured, thus preventing the second conductive line CO2 and the second, third, and fourth contacts CT2, CT3, and CT4 from being separated from each other, and improving resistance between the second conductive line CO2 and the second, third, and fourth contacts CT2, CT3, and CT4. Furthermore, the bending characteristics of each of the second, third, and fourth contacts CT2, CT3, and CT4 may be improved, thus preventing the second, third, and fourth contacts CT2, CT3, and CT4 from being in contact with other contacts.

Figure 3:
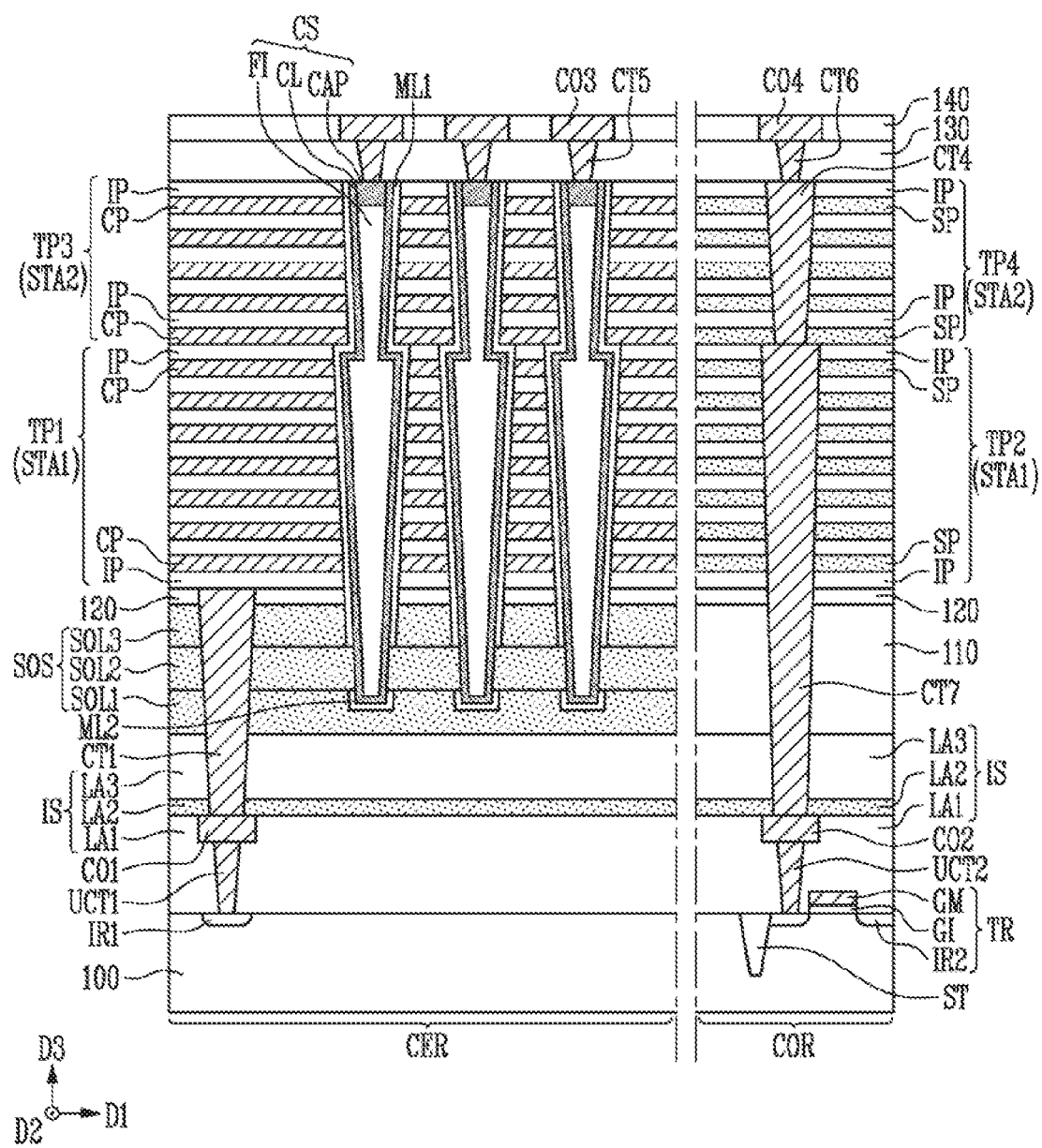
FIG. 3 is a sectional view illustrating a semiconductor device according to an embodiment of the present disclosure.

FIG. 3 is a sectional view illustrating a semiconductor device according to an embodiment of the present disclosure.

The semiconductor device according to this embodiment may be similar to the semiconductor device of FIGS. 1A to 1C, except for the following components.

Referring to FIG. 3, the semiconductor device according to this embodiment may include a substrate 100, an insulating structure IS on the substrate 100, a source structure SOS on the insulating structure IS, and a first insulating layer 110 on the insulating structure IS. The second insulating layer 120, the first stack STA1, and the second stack STA2 may be sequentially provided on the source structure SOS and the first insulating layer 110.

A seventh contact CT7 may be provided to pass through the second stack part TP2 of the first stack STA1, the second insulating layer 120, the first insulating layer 110, and the second and third layers LA2 and LA3 of the insulating structure IS. The seventh contact CT7 may extend in the third direction D3. The seventh contact CT7 may be coupled to the second conductive line CO2 in the first layer LA1 of the insulating structure IS. A lower surface of the seventh contact CT7 may be in contact with the upper surface of the second conductive line CO2 in the first layer LA1 of the insulating structure IS. The seventh contact CT7 may be coupled to the fourth contact CT4 passing through the second stack STA2. An upper surface of the seventh contact CT7 may be in contact with a lower surface of the fourth contact CT4 passing through the second stack STA2.

The width of the seventh contact CT7 may be reduced as it approaches the second conductive line CO2. The width of the seventh contact CT7 may be reduced as the level is reduced. A height of the seventh contact CT7 may be greater than the height of the first contact CT1 passing through the source structure SOS. A level of the lower surface of the seventh contact CT7 may be the same as the level of the lower surface of the first contact CT1. A level of the upper surface of the seventh contact CT7 may be disposed to be higher than the level of the upper surface of the first contact CT1. The level of the upper surface of the seventh contact CT7 may be the same as the level of the boundary of the first and second stacks STA1 and STA2. A portion of the upper surface of the seventh contact CT7 may be in contact with the lower surface of the second stack STA2.

A height of the seventh contact CT7 may be smaller than the height of the channel structure CS. A sum of heights of the seventh contact CT7 and the fourth contact CT4 may be greater than the height of the channel structure CS. The seventh contact CT7 may include a conductive material. For example, the seventh contact CT7 may include aluminum, copper, or tungsten.

The semiconductor device according to this embodiment may be configured such that the plurality of contacts CT4 and CT7 coupled to the peripheral transistor TR is formed to pass through the first insulating layer 110, the first stack STA1, and the second stack STA2. Thus, each of the fourth and seventh contacts CT4 and CT7 may be relatively lower in height. Thus, the width of the lower surface of each of the fourth and seventh contacts CT4 and CT7 may be sufficiently secured, thus preventing the second conductive line CO2, the seventh contact CT7, and the fourth contact CT4 from being separated from each other, and improving resistance between the second conductive line CO2, the seventh contact CT7, and the fourth contact CT4. Furthermore, the bending characteristics of each of the fourth and seventh contacts CT4 and CT7 may be improved, thus preventing the fourth and seventh contacts CT4 and CT7 from being in contact with other contacts.

FIGS. 4A, 4B, 4C, and 4D are sectional views illustrating a method of manufacturing the semiconductor device of FIG. 3.

For the sake of brevity, the same reference numerals are used for the components described with reference to FIG. 3, and a duplicated description will be omitted herein.

The manufacturing method described below is one possible embodiment of the method of manufacturing the semiconductor device of FIG. 3. The method of manufacturing the semiconductor device of FIG. 3 is not limited to the manufacturing method that is described below.

The manufacturing method according to the embodiment of FIGS. 4A to 4D may be similar to the manufacturing method according to the embodiment of FIGS. 2A to 2I, except for the following differences.

Figure 4A:
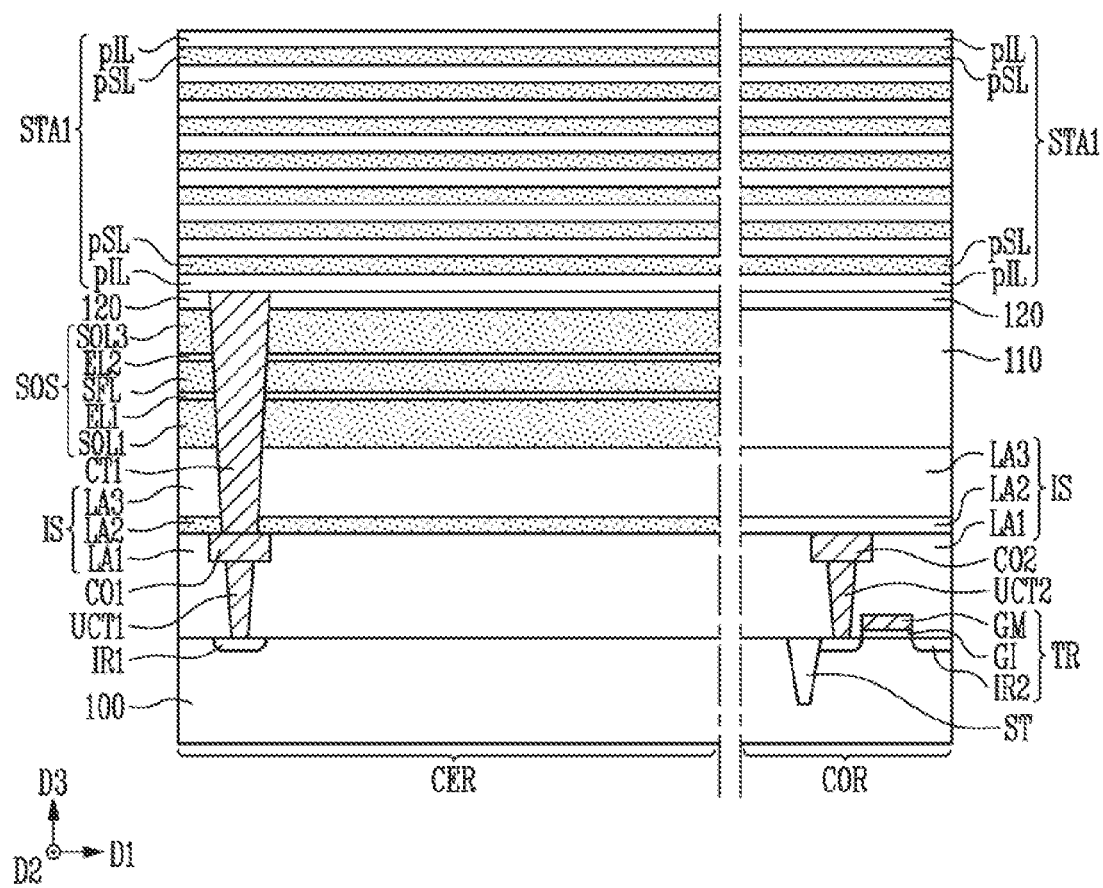
FIGS. 4A, 4B, 4C, and 4D are sectional views illustrating a method of manufacturing the semiconductor device of FIG. 3.

Referring to FIG. 4A, the element separation layer ST and the first impurity region IR1 may be formed in the substrate 100, and the peripheral transistor TR may be formed on the substrate 100. Subsequently, the insulating structure IS, the first and second under contacts UCT1 and UCT2, and the first and second conductive lines CO1 and CO2 may be formed on the substrate 100.

The source structure SOS and the first insulating layer 110 may be formed on the insulating structure IS. The second insulating layer 120 may be formed on the source structure SOS and the first insulating layer 110. The first contact CT1 may be formed to pass through the second and third layers LA2 and LA3 of the insulating structure IS, the source structure SOS, and the second insulating layer 120.

The first stack STA1 may be formed on the second insulating layer 120. The first stack STA1 may cover the first contact CT1.

Figure 4B:
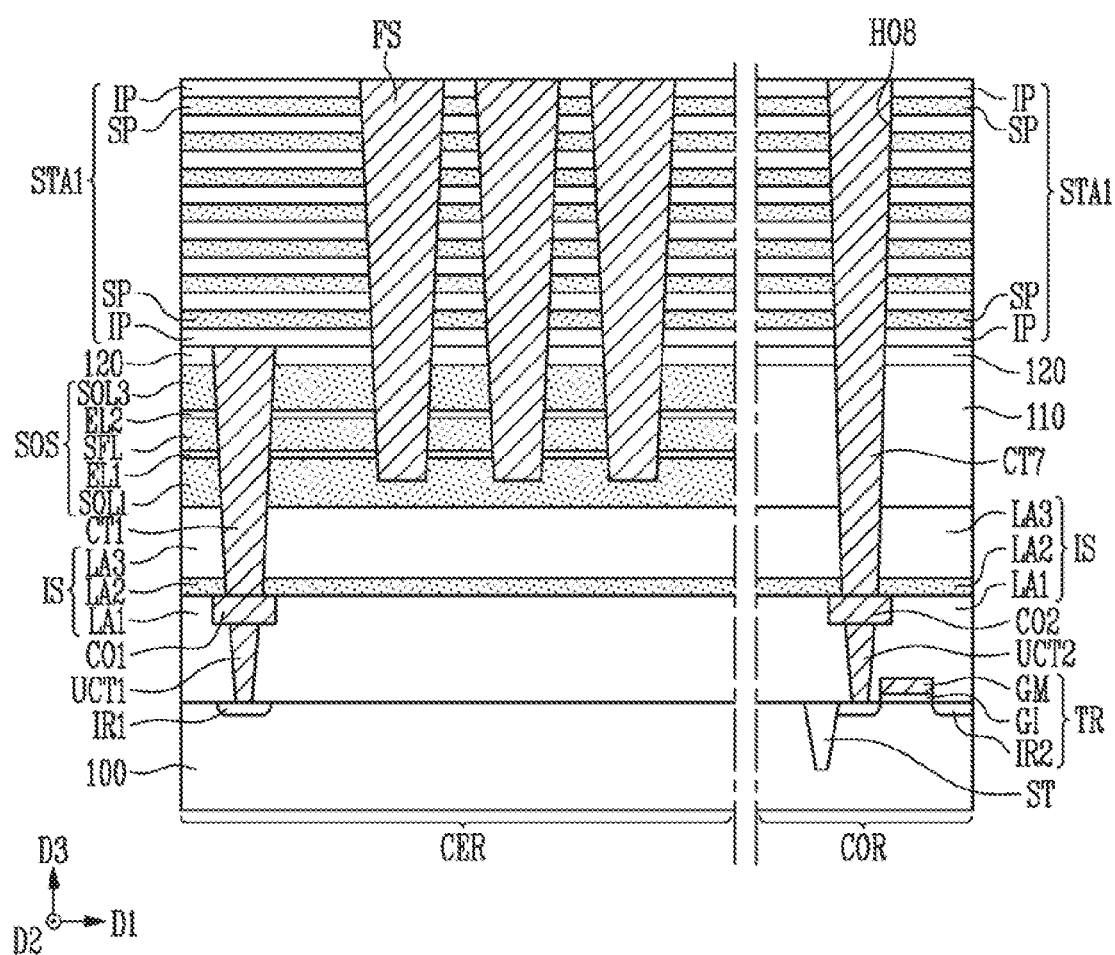

Referring to FIG. 4B, the seventh contact CT7 may be formed to pass through the first stack STA1, the second insulating layer 120, the first insulating layer 110, and the second and third layers LA2 and LA3 of the insulating structure IS. The formation of the seventh contact CT7 may include the formation of an eighth hole HO2 passing through the first stack STA1, the second insulating layer 120, the first insulating layer 110, and the second and third layers LA2 and LA3 of the insulating structure IS, and the formation of the seventh contact CT7 in the eighth hole HO8.

The sacrificial structures FS may be formed to pass through the first stack STA1, the second insulating layer 120, and a portion of the source structure SOS.

Figure 4C:
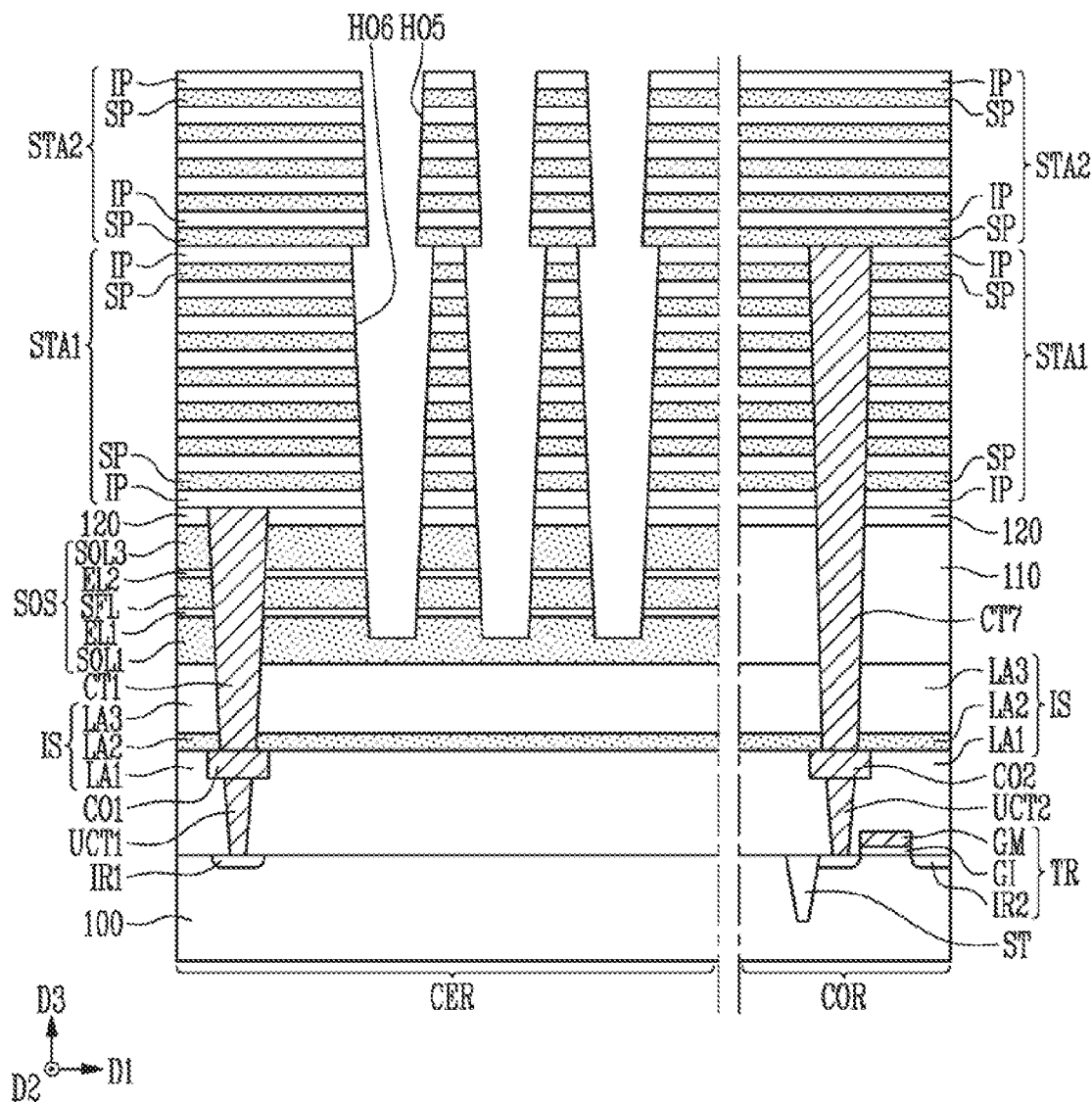

Referring to FIG. 4C, the second stack STA2 may be formed on the first stack STA1. Subsequently, the fifth holes HO5 may be formed to pass through the second stack STA2, and the sixth holes HO6 may be formed by removing the sacrificial structures FS.

Figure 4D:
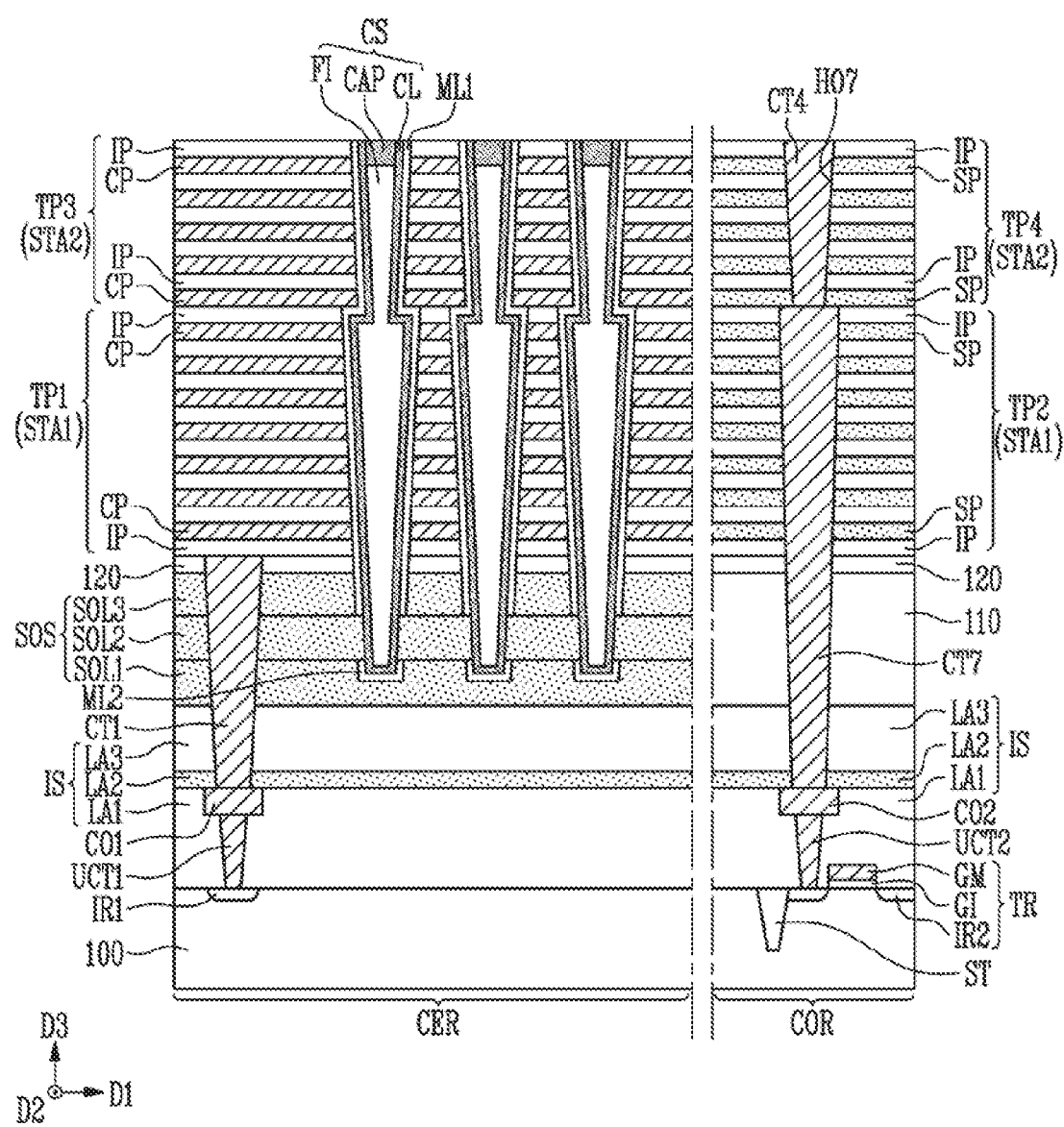

Referring to FIG. 4D, a channel structure CS, a first memory layer ML1, and a second memory layer ML2 may be formed in the fifth and sixth holes HO5 and HO6. The first sacrificial patterns SP1 of the first and second stacks STA1 and STA2 may be replaced with the conductive patterns CR The first etching stop layer EL1, the second etching stop layer EL2, and the source sacrificial layer SFL of the source structure SOS may be replaced with the second source layer SOL2.

The fourth contact CT4 may be formed to pass through the second stack STA2. The formation of the fourth contact CT4 may include the formation of the seventh hole HO7 passing through the second stack STA2 to expose the upper surface of the seventh contact CT7, and the formation of the fourth contact CT4 in the seventh hole HO7.

Subsequently, the third insulating layer 130 and the fifth and sixth contacts CT5 and CT6 passing through the third insulating layer 130 may be formed (see FIG. 3). Subsequently, the fourth insulating layer 140 and the third and fourth conductive lines CO3 and CO4 passing through the fourth insulating layer 140 may be formed (see FIG. 3).

The method of manufacturing the semiconductor device according to this embodiment may be configured such that the plurality of contacts CT4 and CT7 coupled to the peripheral transistor TR is formed to pass through the first insulating layer 110, the first stack STA1, and the second stack STA2. Thus, each of the fourth and seventh contacts CT4 and CT7 may be relatively lower in height. Thus, the width of the lower surface of each of the fourth and seventh contacts CT4 and CT7 may be sufficiently secured, thus preventing the second conductive line CO2, the seventh contact CT7, and the fourth contact CT4 from being separated from each other, and improving resistance between the second conductive line CO2, the seventh contact CT7, and the fourth contact CT4. Furthermore, the bending characteristics of each of the fourth and seventh contacts CT4 and CT7 may be improved, thus preventing the fourth and seventh contacts CT4 and CT7 from being in contact with other contacts.

Figure 5:
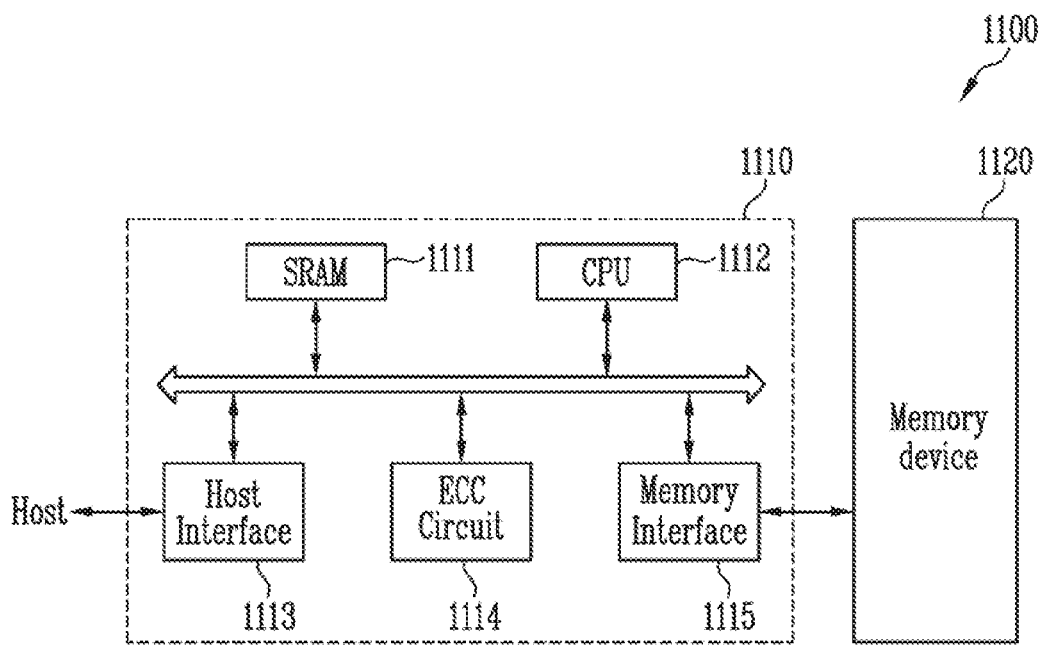
FIG. 5 is a block diagram illustrating the configuration of a memory system according to an embodiment of the present disclosure.

FIG. 5 is a block diagram illustrating the configuration of a memory system according to an embodiment of the present disclosure.

Referring FIG. 5, the memory system 1100 according to an embodiment of the present disclosure includes a memory device 1120 and a memory controller 1110.

The memory device 1120 may include the structure described with reference to FIGS. 1A to 1C and FIG. 3. The memory device 1120 may be a multi-chip package formed of a plurality of flash memory chips.

The memory controller 1110 may control the memory device 1120, and include static random access memory (SRAM) 1111, a central processing unit (CPU) 1112, a host interface 1113, an error correction code (ECC) circuit 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC circuit 1114 may detect and correct an error included in the data that is read from the memory device 1120, and the memory interface 1115 may interface with the memory device 1120. In addition, the memory controller 1110 may further include read only memory (ROM) or the like that stores code data for interfacing with the host.

The above-described memory system 1100 may be a memory card or a solid state disk (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (DATA), a small computer system interface (SCSI), an enhanced small disk interface (ESDI), and an integrated drive electronics (IDE) protocols.

Figure 6:
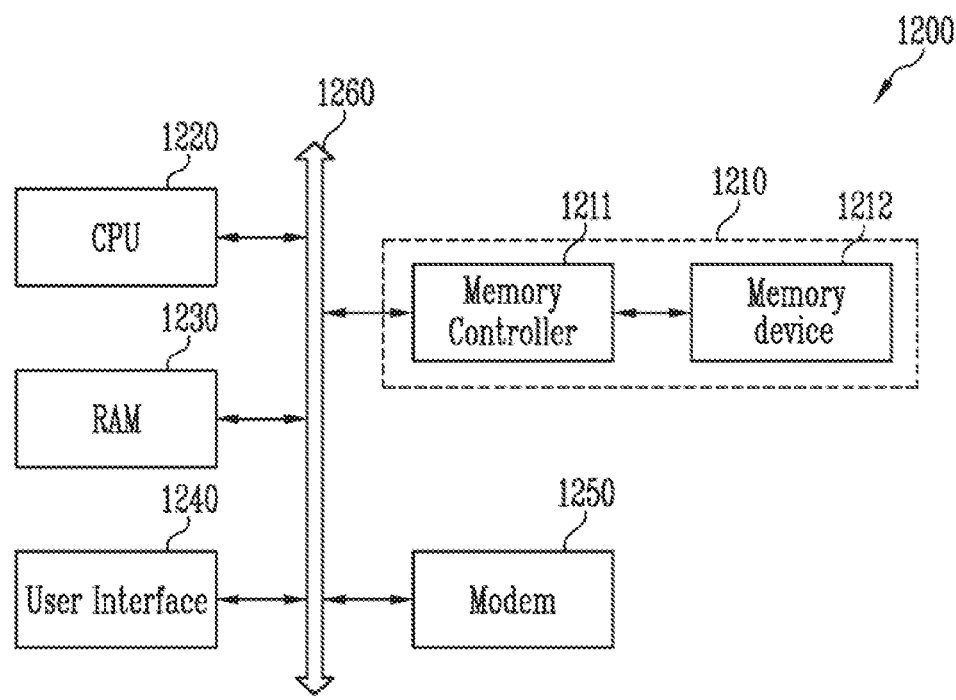
FIG. 6 is a block diagram illustrating the configuration of a computing system according to an embodiment of the present disclosure.

FIG. 6 is a block diagram illustrating the configuration of a computing system according to an embodiment of the present disclosure.

Referring to FIG. 6, the computing system 1200 according to an embodiment of the present disclosure may include a CPU 1220, random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor CIP, a mobile DRAM, and the like may be further included.

As described above with reference to FIG. 5, the memory system 1210 may be configured with a memory device 1212 and a memory controller 1211.

A semiconductor device according to embodiments of the present disclosure may be configured such that the height of contacts coupled to a peripheral transistor is relatively low. Thus, the bending characteristics of the contacts coupled to the peripheral transistor can be improved, and the width of a lower surface of each of the contacts coupled to the peripheral transistor can be sufficiently secured.

What is claimed is:

1. A method of manufacturing a semiconductor device, the method comprising:
forming a first stack in a cell region and a connection region;
forming a sacrificial structure in the cell region and a first contact in the connection region extending in a vertical direction in the first stack, simultaneously;
forming a second stack over the first stack;
forming a first hole through the second stack to expose the sacrificial structure;
forming a second hole through the first stack by removing the sacrificial structure;
forming a channel structure in the first and second holes; and
forming, after forming the channel structure, a second contact extending in the vertical direction in the second stack and coupled to the first contact.

2. The method according to claim 1, further comprising:
forming a source structure and a first insulating layer disposed on a same level; and
forming a third contact extending in the vertical direction in the source structure and a fourth contact extending in the vertical direction in the first insulating layer,
wherein the fourth contact is coupled to the first contact.

3. The method according to claim 2, wherein the source structure is coupled to the channel structure.

4. The method according to claim 2, wherein a height of the third contact is the same as a height of the fourth contact.

5. The method according to claim 1, wherein a height of the sacrificial structure is greater than a height of the first contact.

6. The method according to claim 1, wherein a level of a boundary between the first and second contacts is the same as a level of a boundary between the first and second stacks.

7. The method according to claim 1, further comprising:
replacing a first portion of a sacrificial pattern of the first stack with a conductive pattern, and retaining a second portion of the sacrificial pattern,
wherein the first portion encloses the channel structure, and
wherein the second portion encloses the first contact.

8. The method according to claim 1, wherein a level of an upper surface of the sacrificial structure is the same as a level of an upper surface of the first contact.

9. A method of manufacturing a semiconductor device, the method comprising:
forming a substrate;
forming an insulating structure over the substrate;
forming a source structure and a first insulating layer over the insulating structure;
forming a first contact extending in the vertical direction in the source structure and a second contact extending in the vertical direction in the first insulating layer;
forming, after forming the first contact and the second contact, a first stack over the first contact, the second contact, the source structure, and the first insulating layer;
forming a third contact extending in the vertical direction in the first stack and coupled to the second contact;
forming a second stack over the first stack; and
forming a fourth contact extending in the vertical direction in the second stack and coupled to the third contact.

10. The method according to claim 9, further comprising:
forming a channel structure through the first and second stacks.

11. The method according to claim 10, wherein forming the channel structure comprises:
forming a sacrificial structure through the first stack;
forming a first hole through the second stack to expose the sacrificial structure; and
removing the sacrificial structure.

12. The method according to claim 10, wherein:
a sum of heights of the second, third, and fourth contacts is greater than a height of the channel structure, and
a sum of heights of the third and fourth contacts is smaller than the height of the channel structure.

13. The method according to claim 9, wherein a width of an upper surface of the third contact is greater than a width of a lower surface of the fourth contact.

14. The method according to claim 13, wherein the upper surface of the third contact is in contact with a lower surface of the second stack.

15. The method according to claim 13, wherein a level of the upper surface of the third contact and a level of the lower surface of the fourth contact are the same as a level of a boundary between the first and second stacks.

16. The method according to claim 9, further comprising:
forming a memory layer extending in the vertical direction in the first and second stacks,
wherein the memory layer comprises:
a first memory part extending in the vertical direction in the second stack, a second memory part extending in the vertical direction in the first stack, and a third memory part coupling the first memory part and the second memory part, and
wherein a level of an upper surface of the third memory part is the same as a level of a boundary between the third and fourth contacts.

17. The method according to claim 9, wherein a height of the first contact is the same as a height of the second contact.

\* \* \* \* \*